(12) United States Patent
Jeong et al.

(10) Patent No.: US 12,300,673 B2
(45) Date of Patent: May 13, 2025

(54) DISPLAY APPARATUS

(71) Applicant: LG ELECTRONICS INC., Seoul (KR)

(72) Inventors: Youngkyu Jeong, Seoul (KR); Hwankuk Yuh, Seoul (KR); Byeongjun Choi, Seoul (KR); Sangyeol Lee, Seoul (KR); Jeongtak Oh, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 440 days.

(21) Appl. No.: 17/737,648

(22) Filed: May 5, 2022

(65) Prior Publication Data
US 2022/0367425 A1 Nov. 17, 2022

(30) Foreign Application Priority Data
May 17, 2021 (KR) .................. 10-2021-0063505

(51) Int. Cl.
*H01L 25/075* (2006.01)
*H10H 20/816* (2025.01)
*H10H 20/831* (2025.01)

(52) U.S. Cl.
CPC ..... *H01L 25/0753* (2013.01); *H10H 20/8162* (2025.01); *H10H 20/8312* (2025.01)

(58) Field of Classification Search
CPC . H01L 25/0753; H01L 33/145; H01L 33/382; H01L 33/0095; H01L 33/20; H01L 33/38; H01L 27/156; H01L 33/50
See application file for complete search history.

(56) References Cited

U.S. PATENT DOCUMENTS

| | | | | |
|---|---|---|---|---|
| 10,643,981 | B2* | 5/2020 | Schuele | H01L 33/38 |
| 11,295,680 | B2* | 4/2022 | Wyatt | H10K 59/352 |
| 11,652,196 | B2* | 5/2023 | Kim | H01L 25/0753 |
| | | | | 257/89 |
| 2019/0393069 | A1* | 12/2019 | Paranjpe | H01L 33/62 |
| 2020/0286949 | A1 | 9/2020 | Lee et al. | |
| 2021/0097929 | A1* | 4/2021 | Li | G09G 3/2007 |
| 2021/0288105 | A1* | 9/2021 | Kawanishi | H01L 25/0753 |

* cited by examiner

*Primary Examiner* — Kyoung Lee
*Assistant Examiner* — Sophia W Kao
(74) *Attorney, Agent, or Firm* — Birch, Stewart, Kolasch & Birch, LLP

(57) ABSTRACT

A display device can include a substrate including a plurality of first sub-pixels, a plurality of second sub-pixels, a plurality of third sub-pixels; a plurality of first semiconductor light emitting devices disposed in the plurality of first sub-pixels, and configured to generate first color light of a first main wave; a plurality of second semiconductor light emitting devices disposed in the plurality of second sub-pixels, and configured to generate second color light of a second main wave; and a plurality of third semiconductor light emitting devices disposed in the plurality of third sub-pixels, and configured to generate third color light of a third main wave, in which at least some of the plurality of first semiconductor light emitting devices have different light emitting regions to compensate for a wave deviation of the first main wave.

20 Claims, 23 Drawing Sheets

[FIG. 1A]
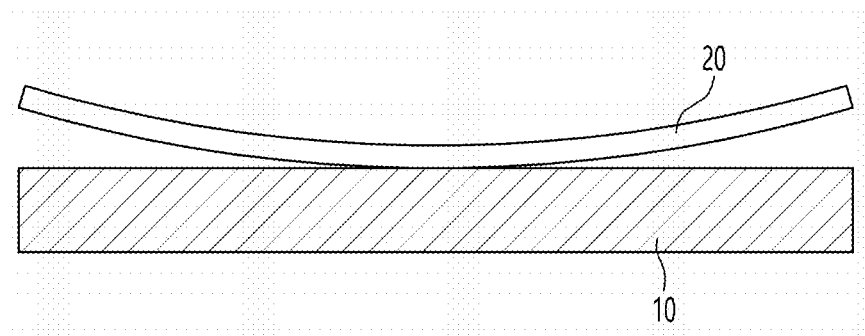
[FIG. 1B]
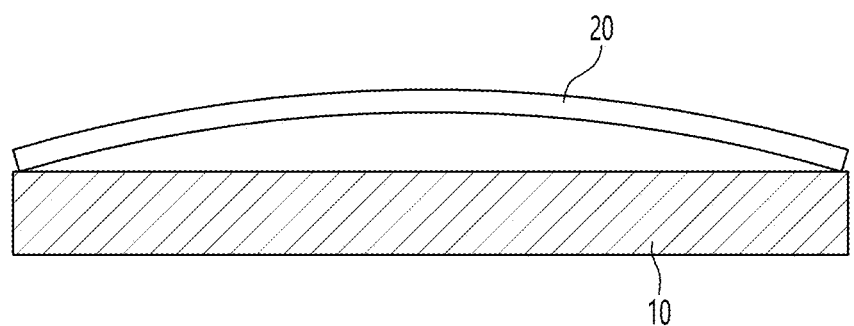

[FIG. 2A]
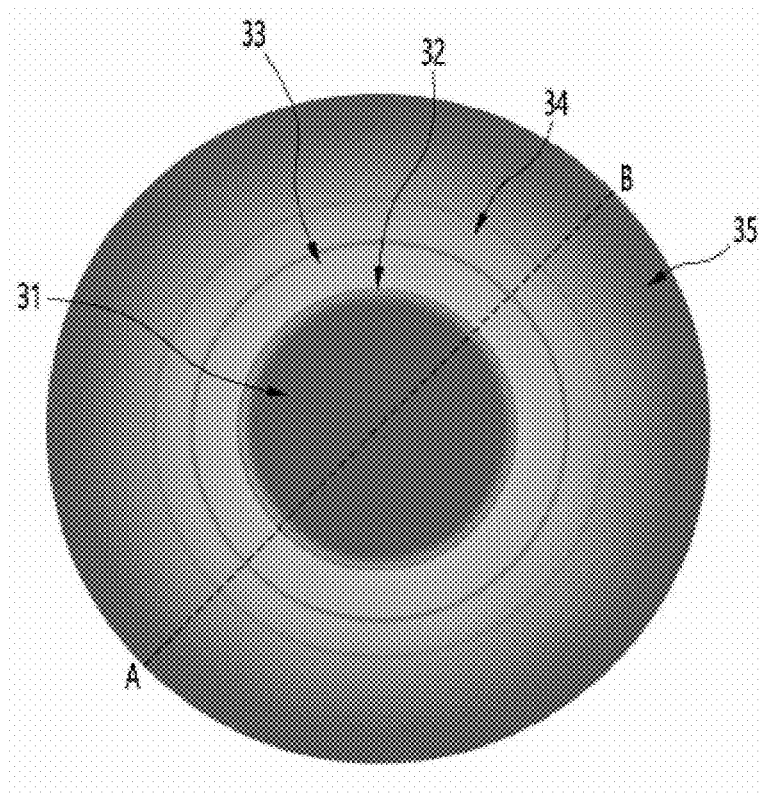
[FIG. 2B]
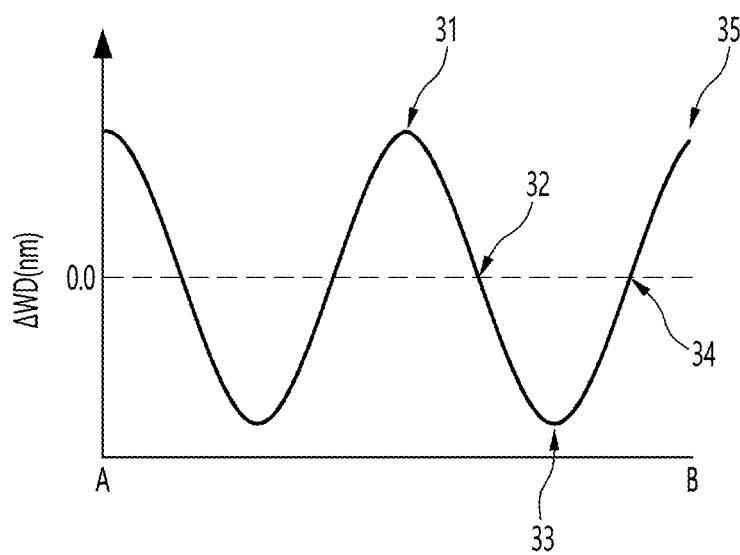

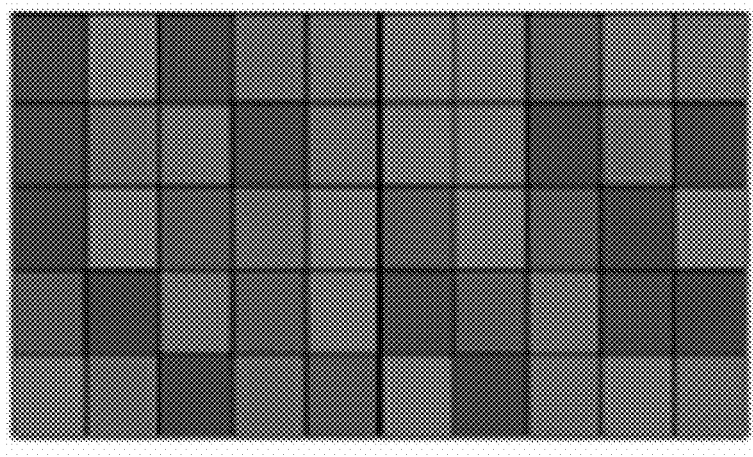
[FIG. 3]

[FIG. 4]
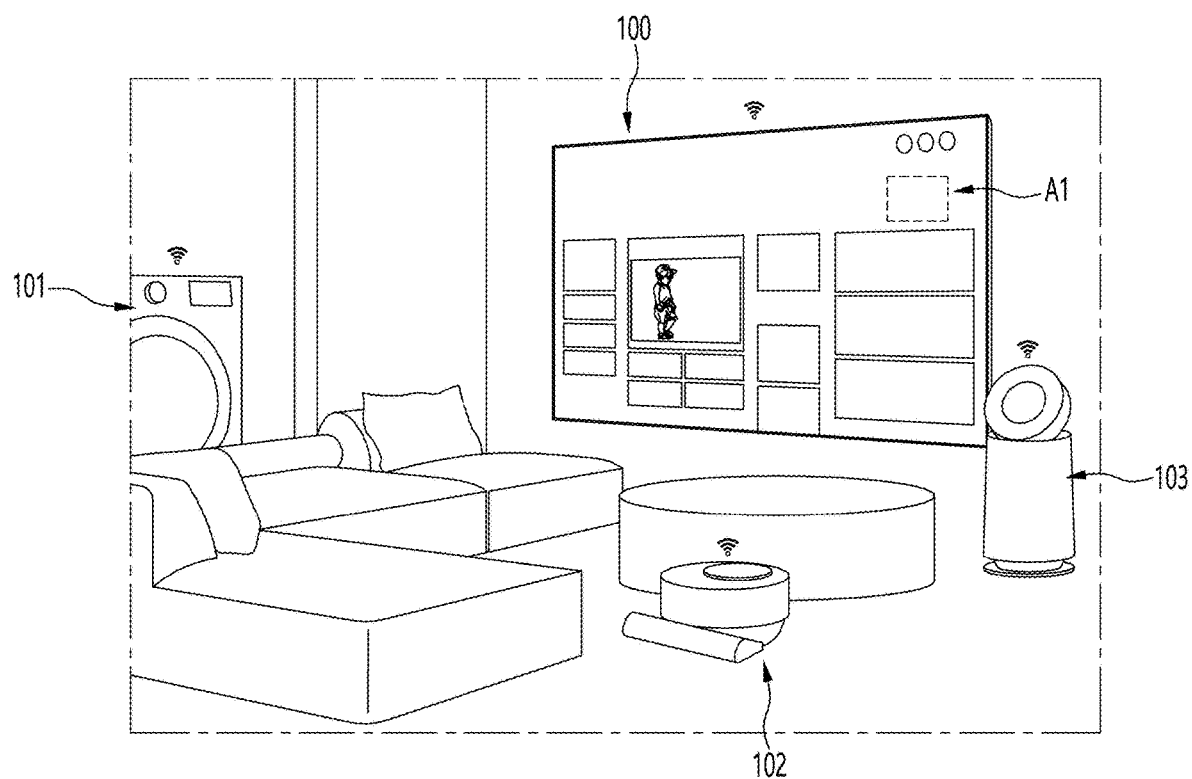

[FIG. 5]
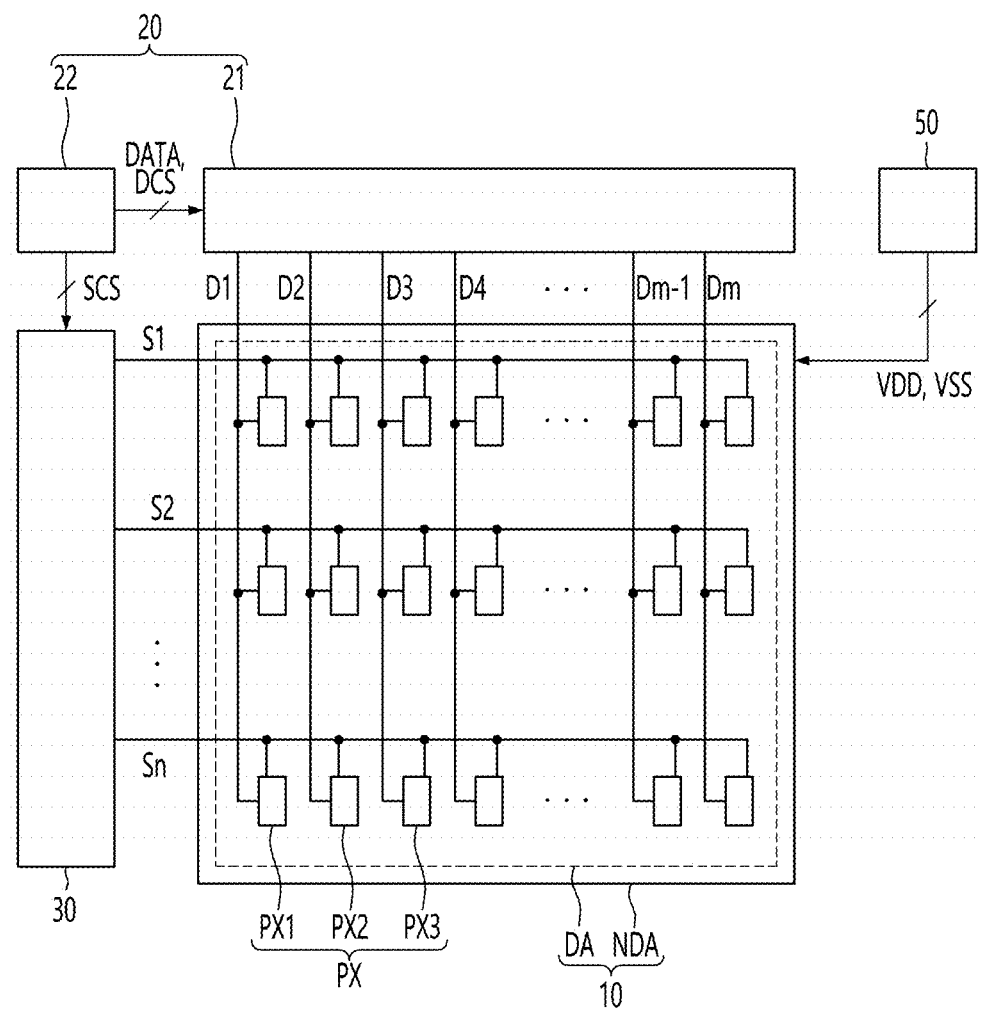

[FIG. 6]
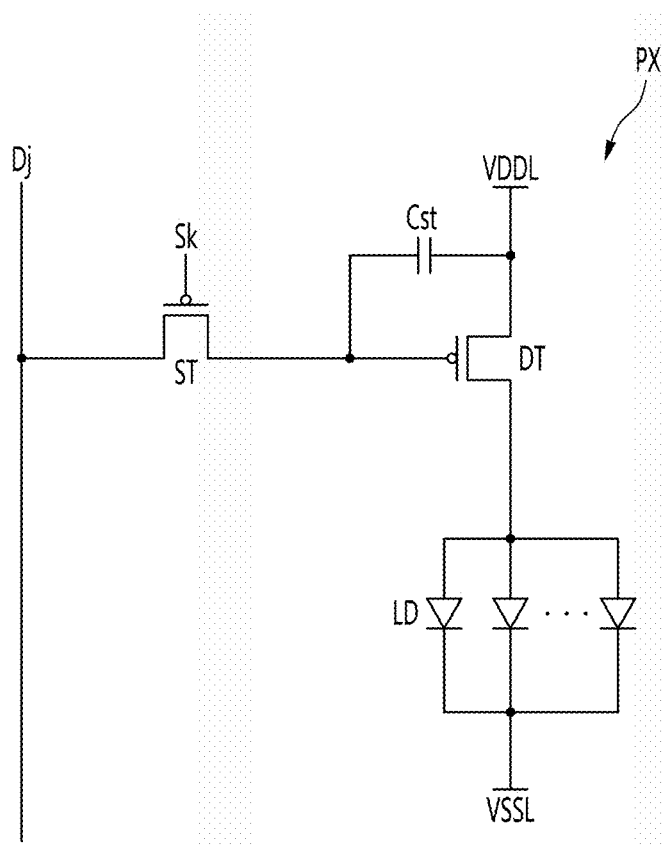

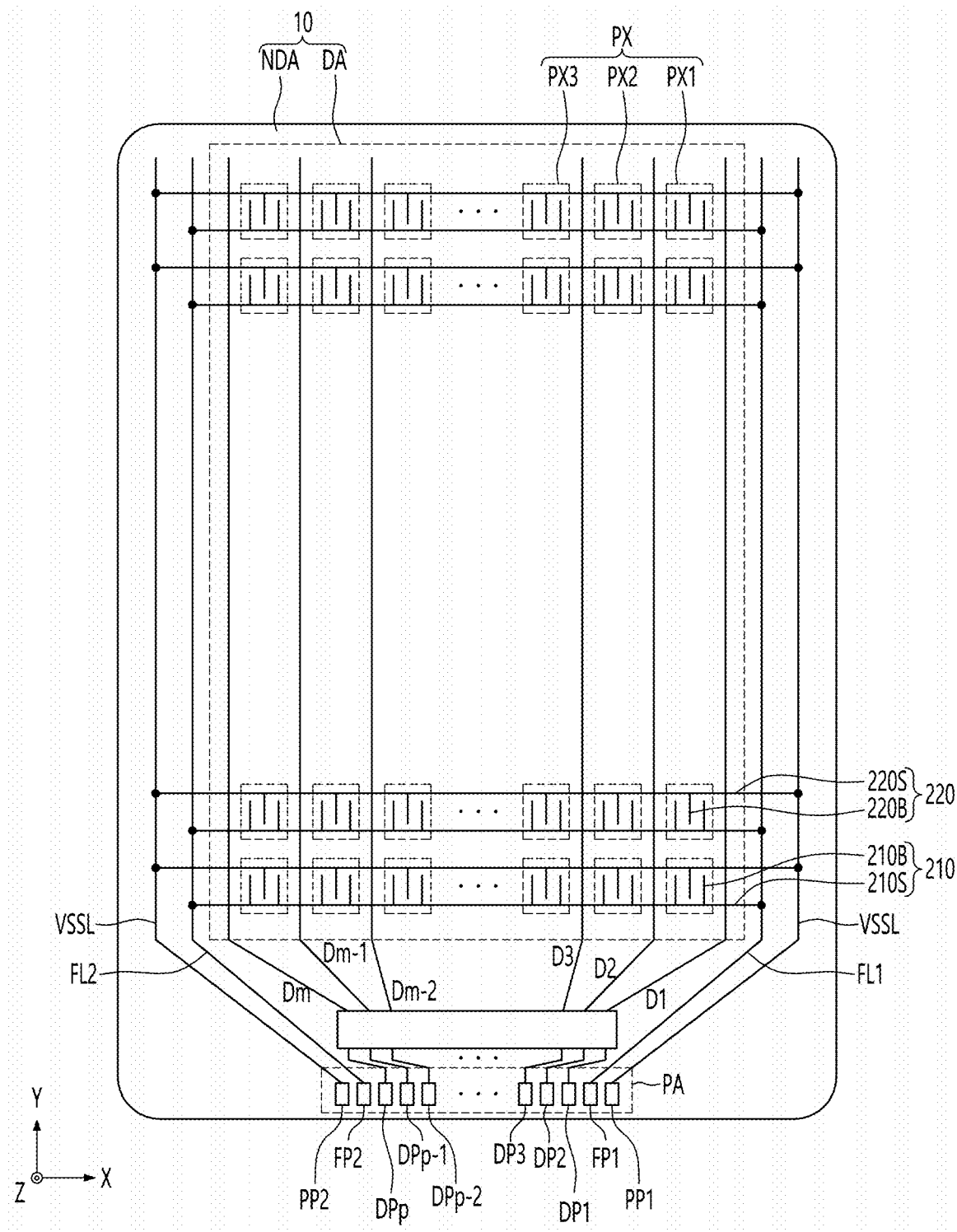
[FIG. 7]

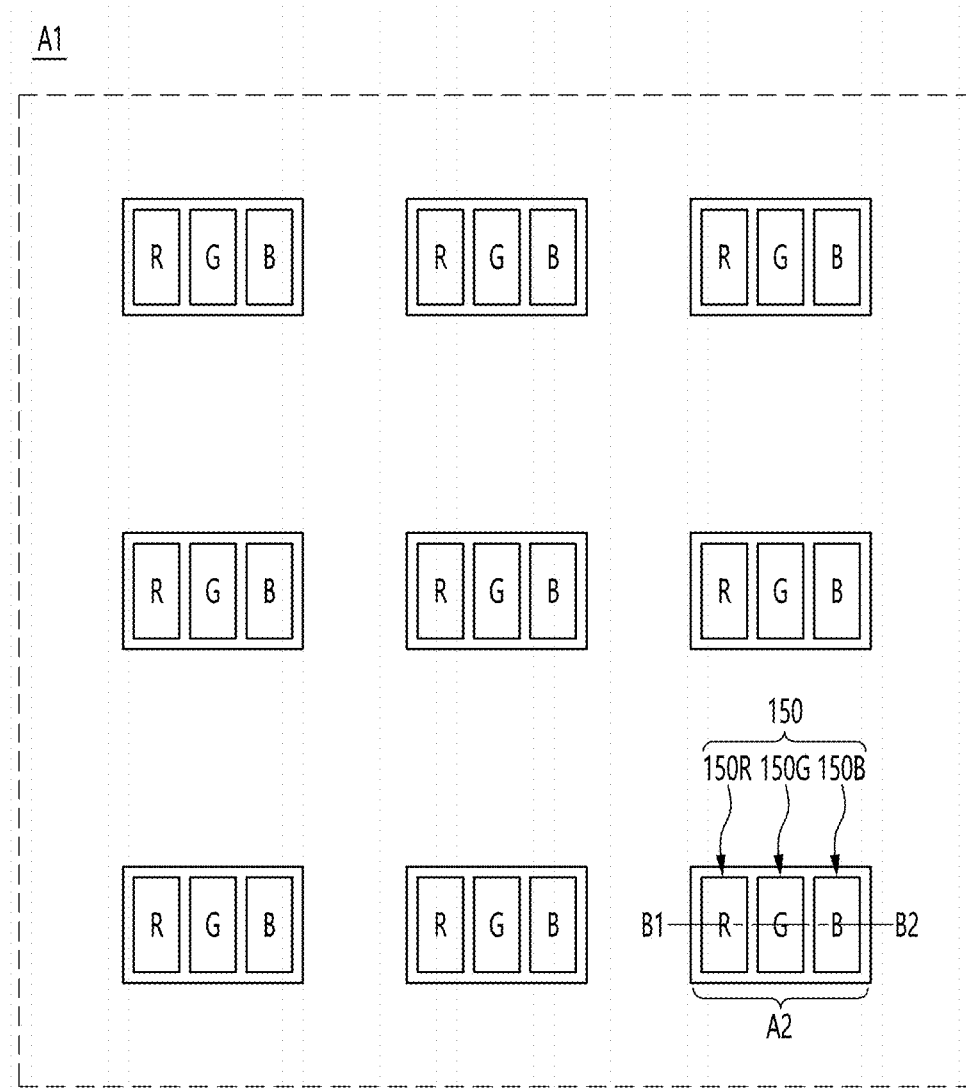
[FIG. 8]

[FIG. 9]
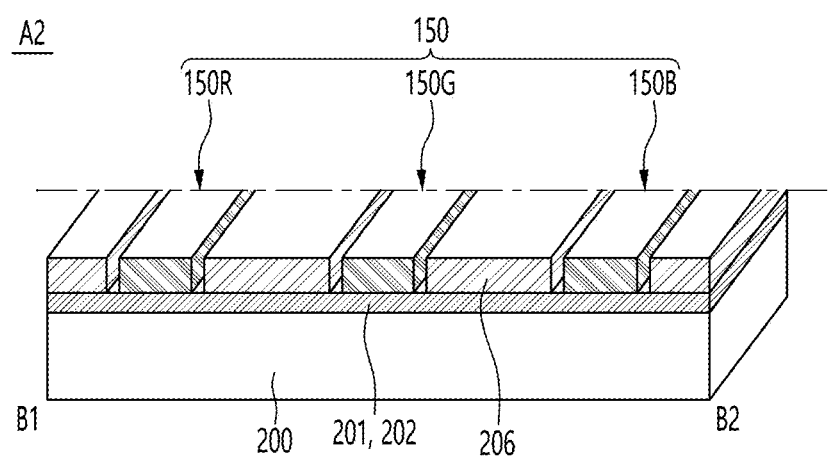
[FIG. 10]
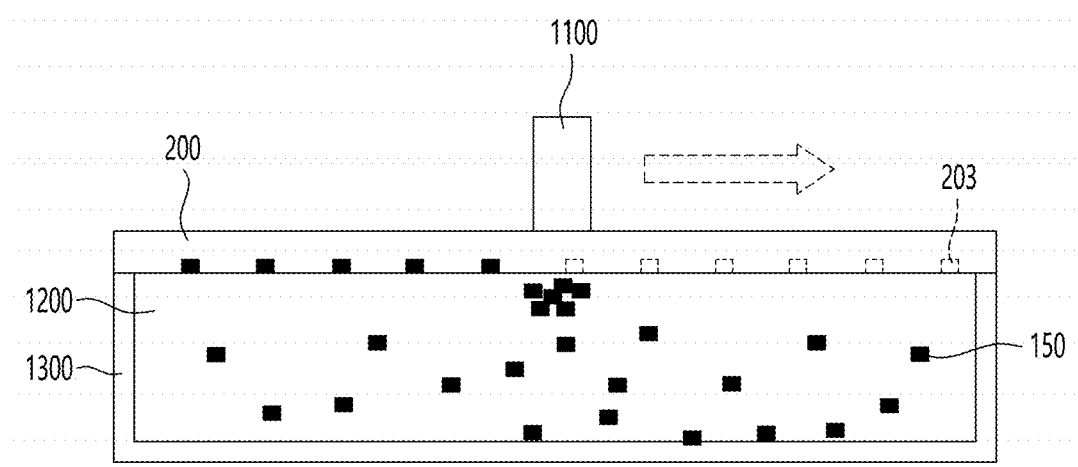

[FIG. 11]
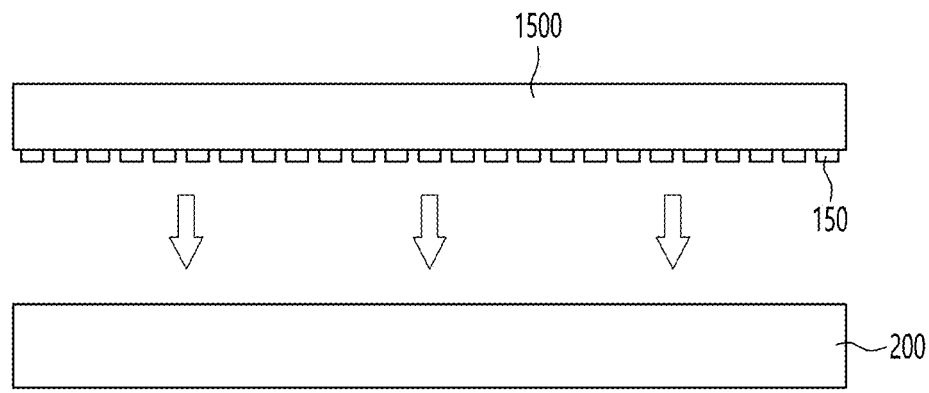
[FIG. 12]
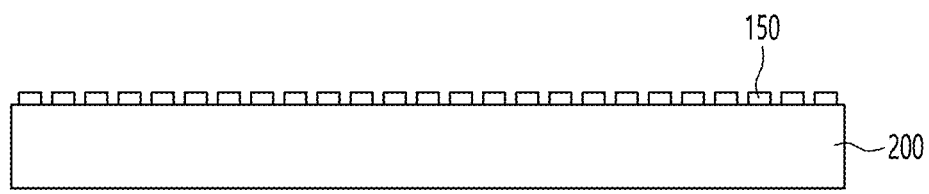
[FIG. 13]
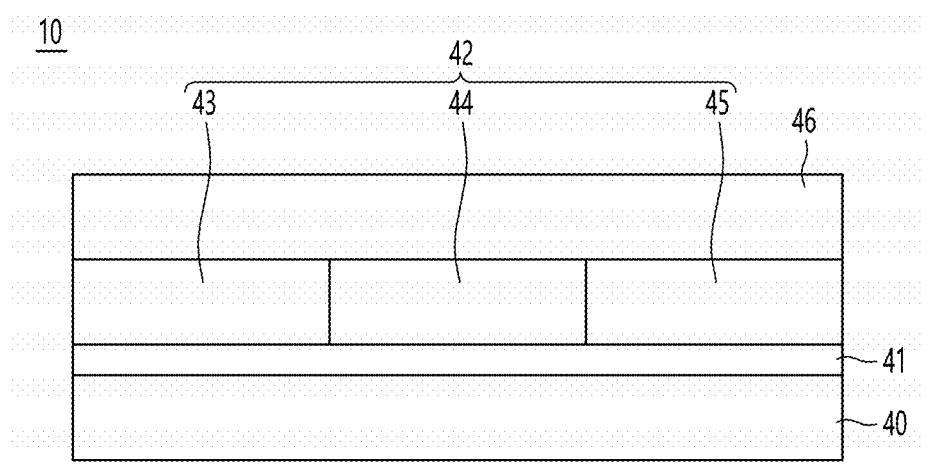

[FIG. 14]
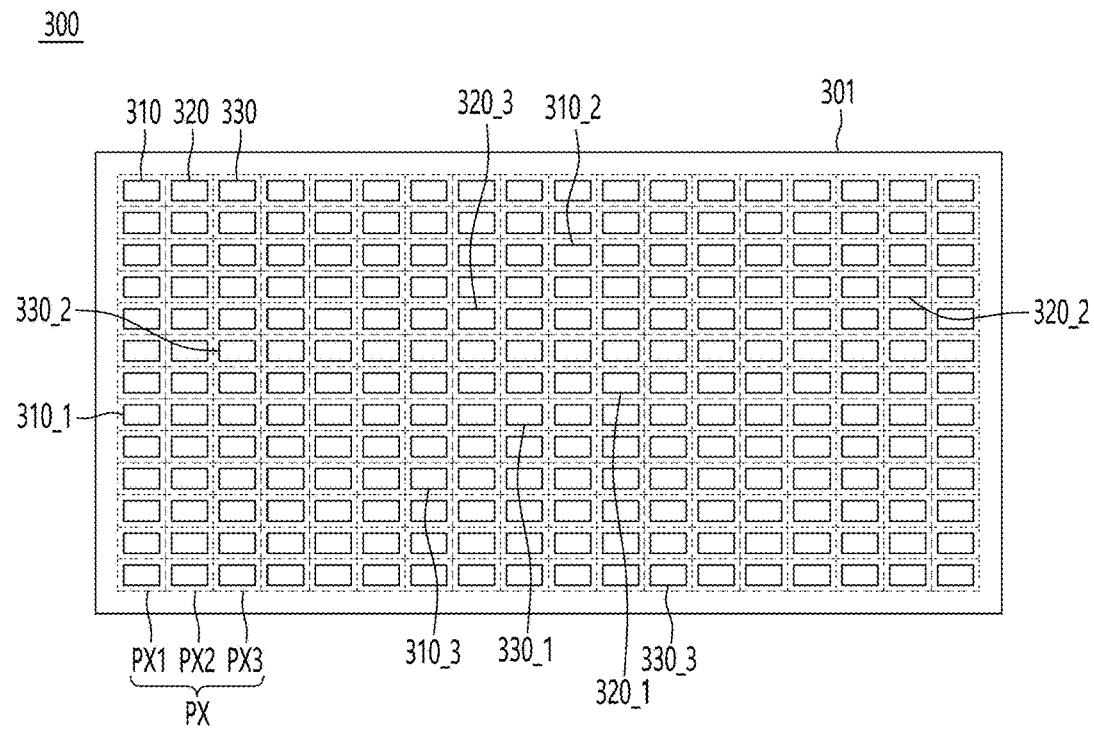
[FIG. 15]
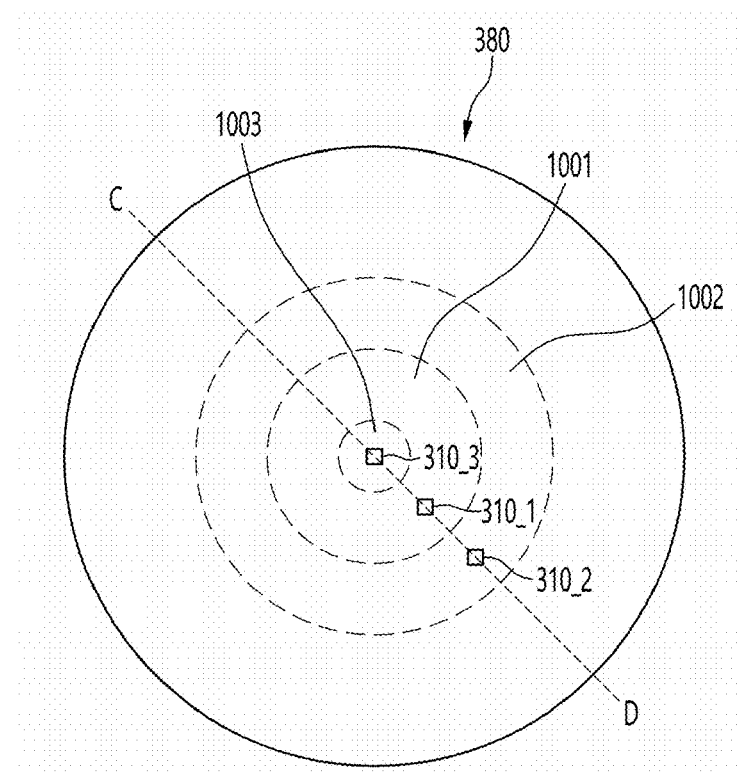

[FIG. 16]
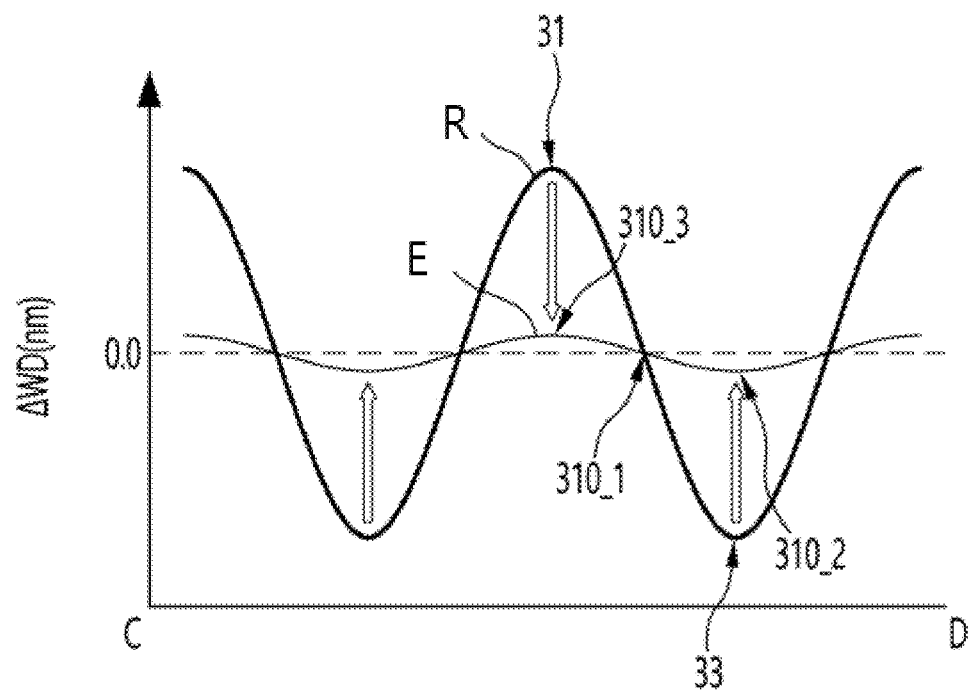
[FIG. 17]
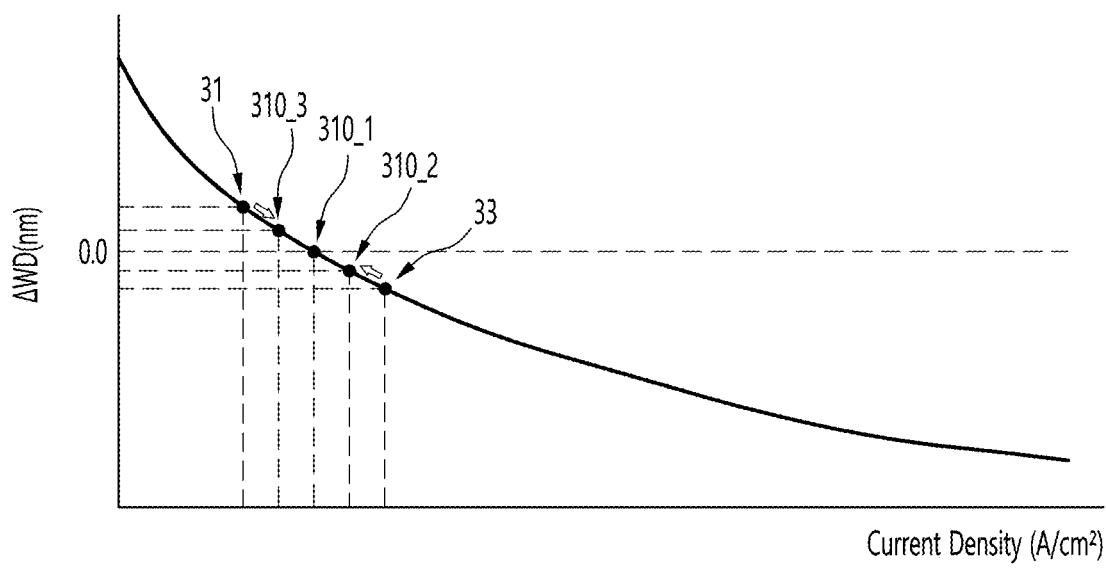

[FIG. 18]
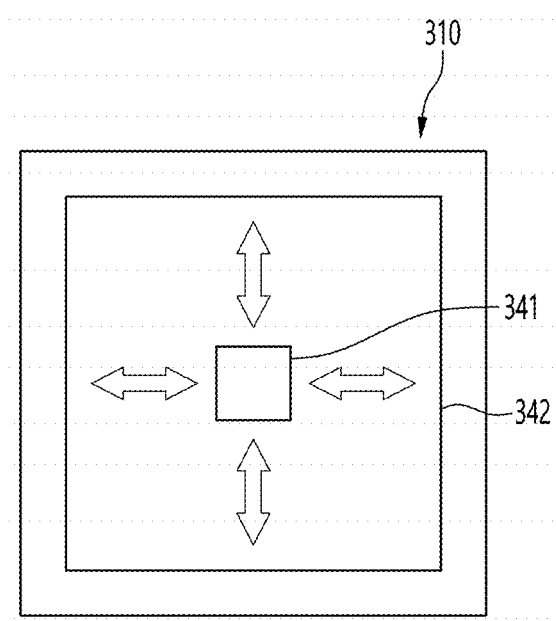

[FIG. 19A]
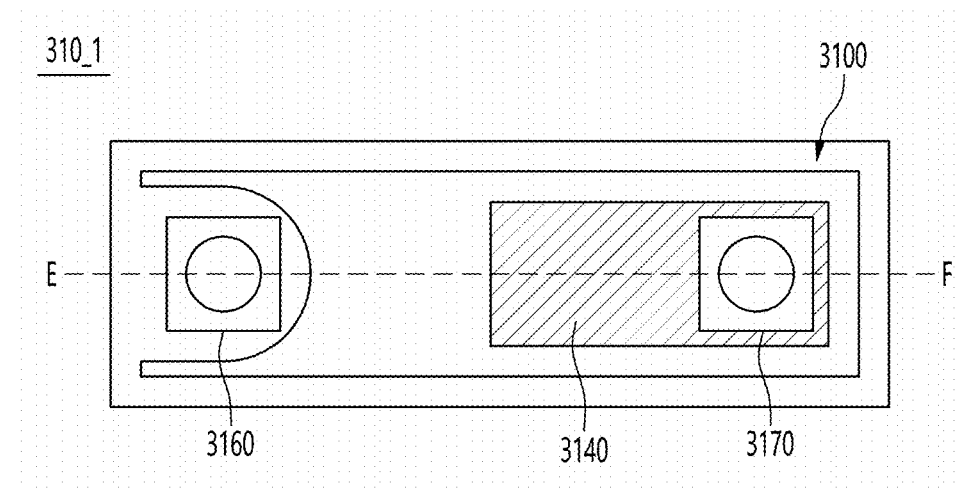
[FIG. 19B]
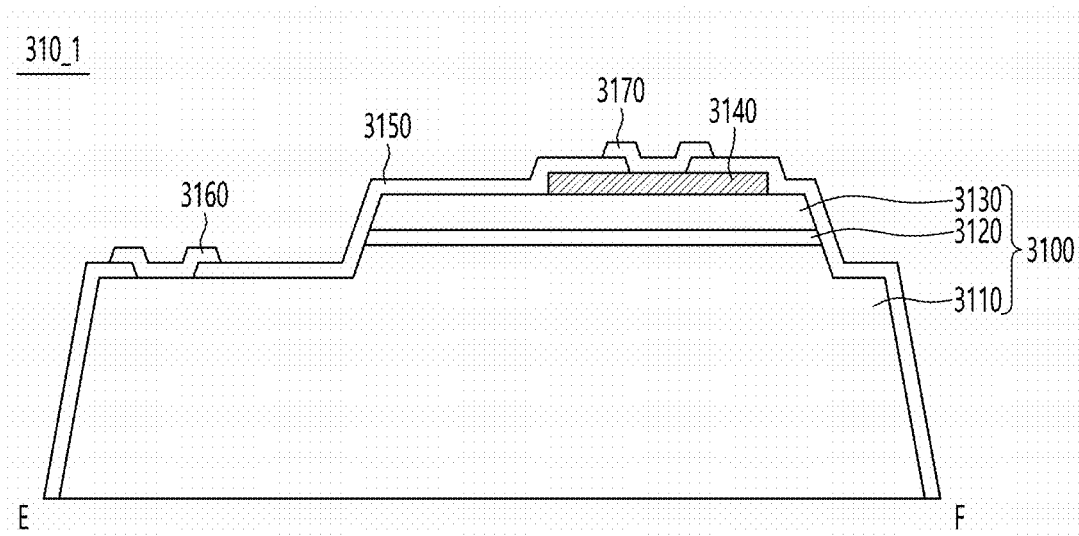

[FIG. 20A]
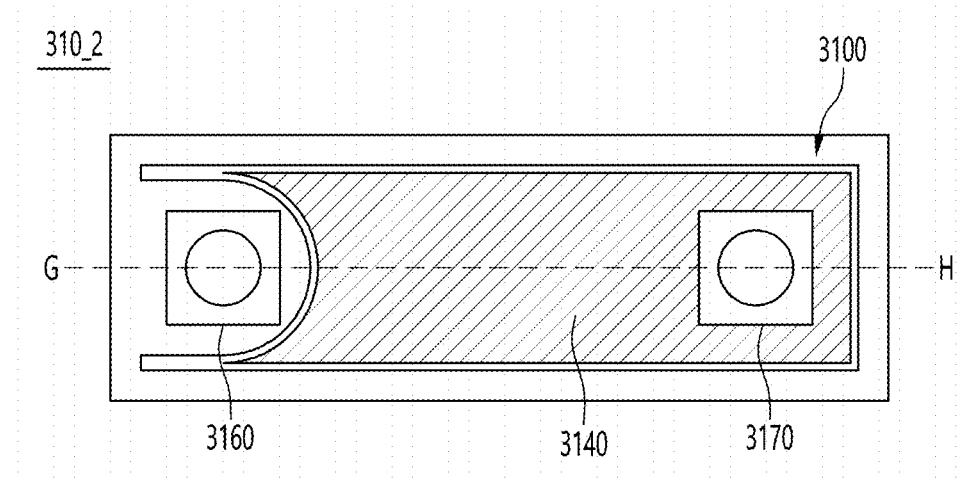
[FIG. 20B]
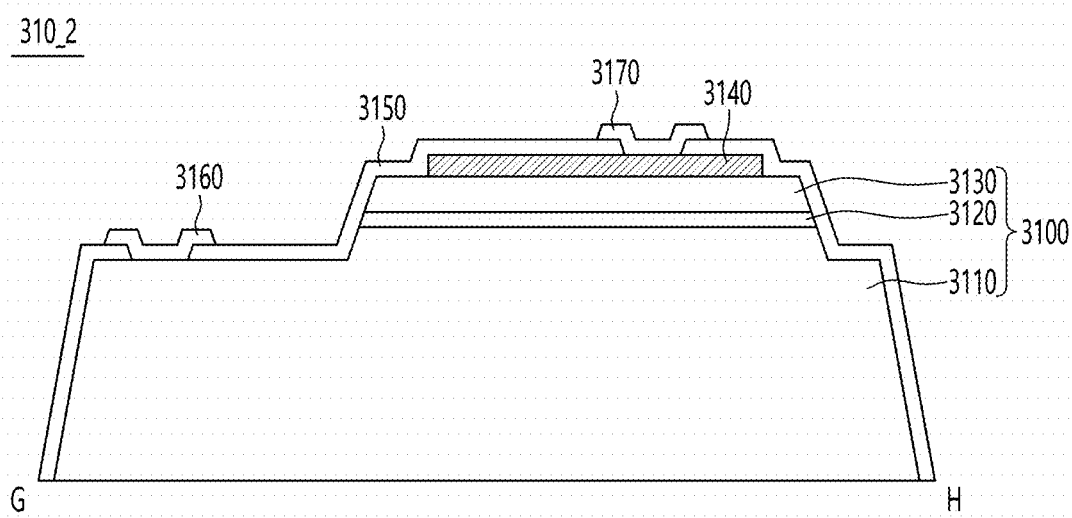

[FIG. 21A]
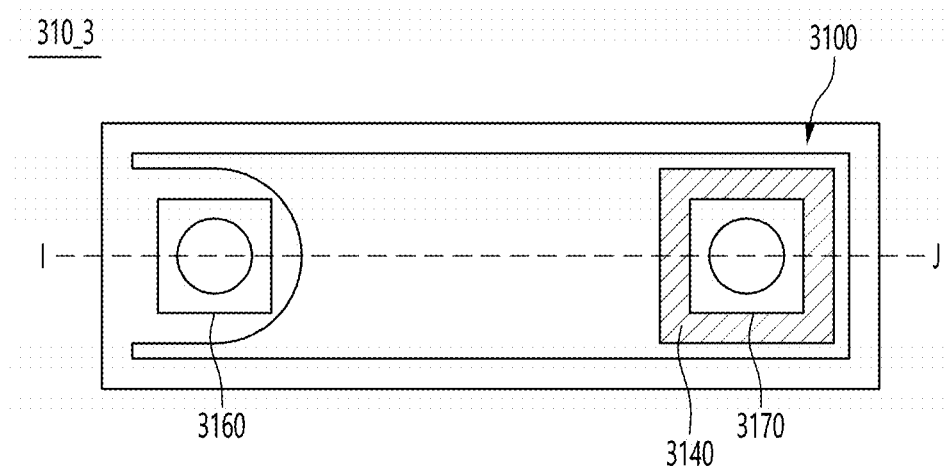
[FIG. 21B]
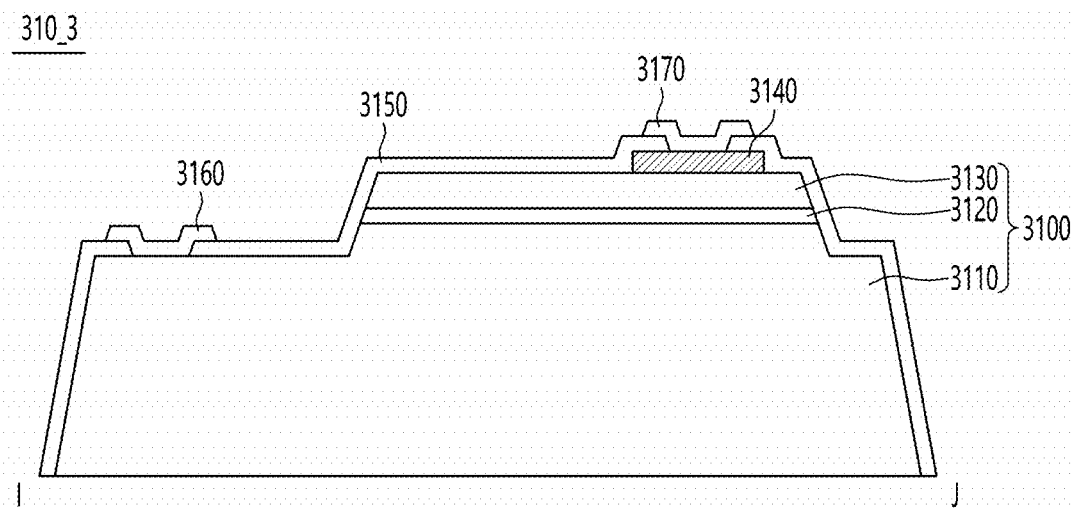

[FIG. 22A]
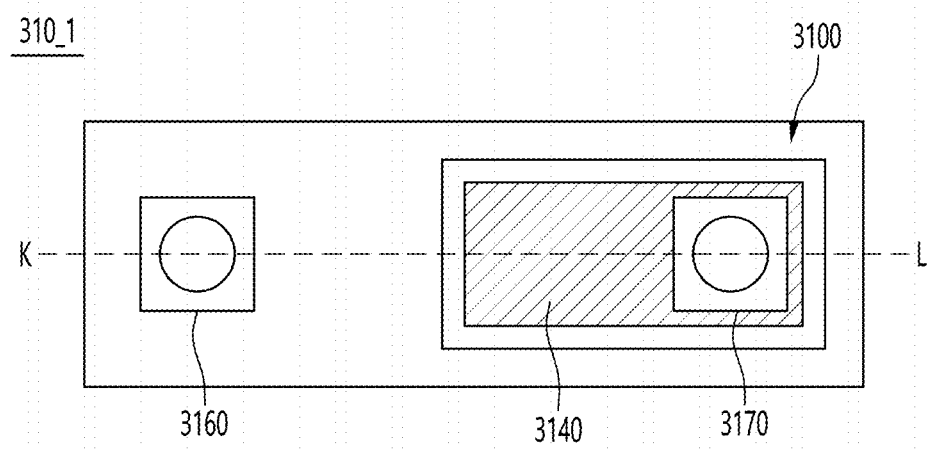
[FIG. 22B]
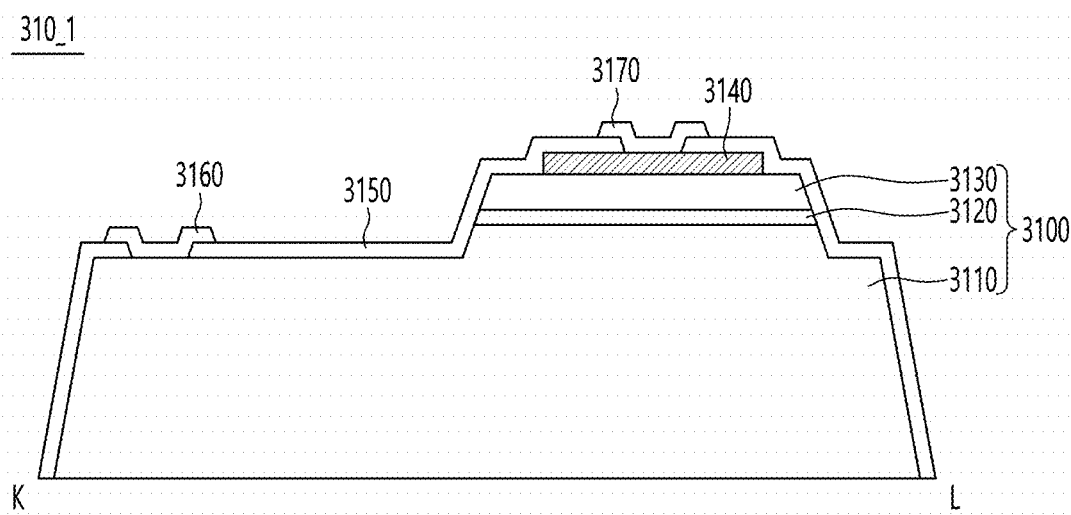

[FIG. 23A]
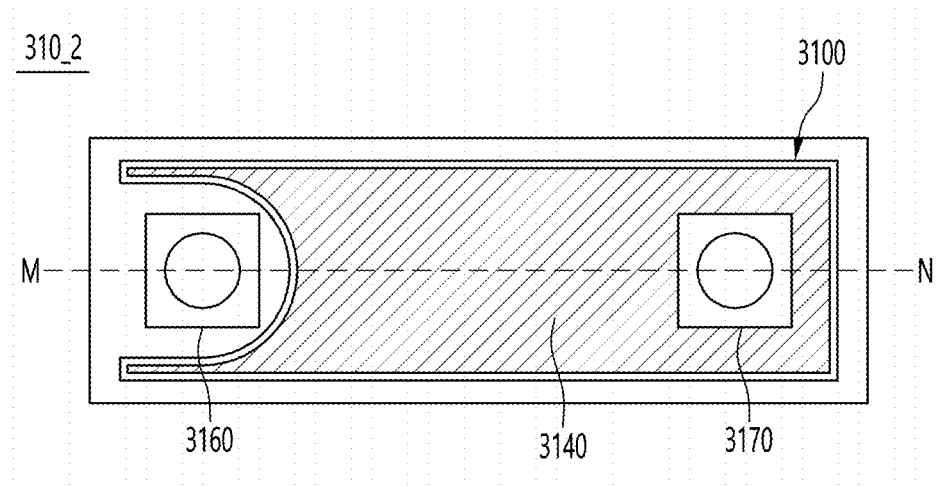
[FIG. 23B]
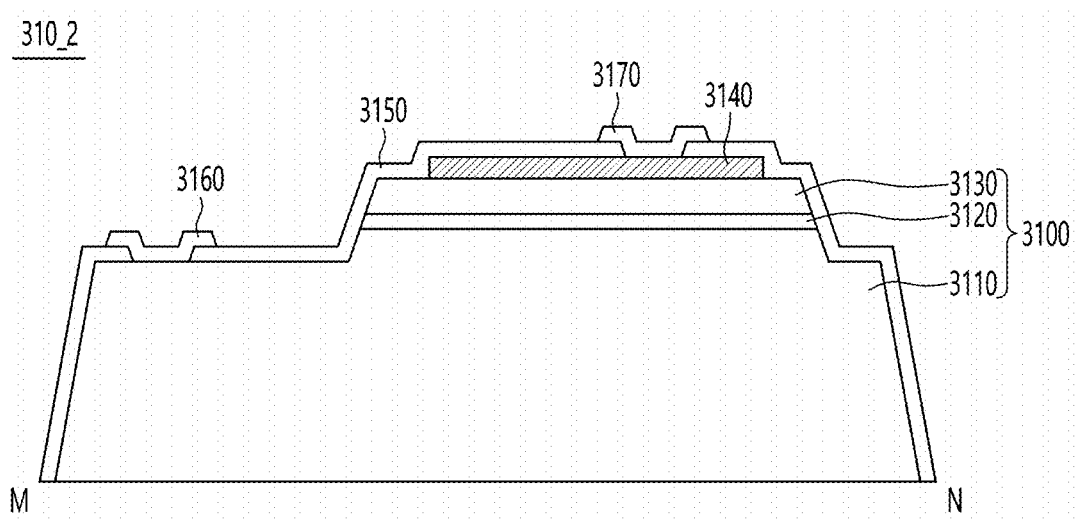

[FIG. 24A]
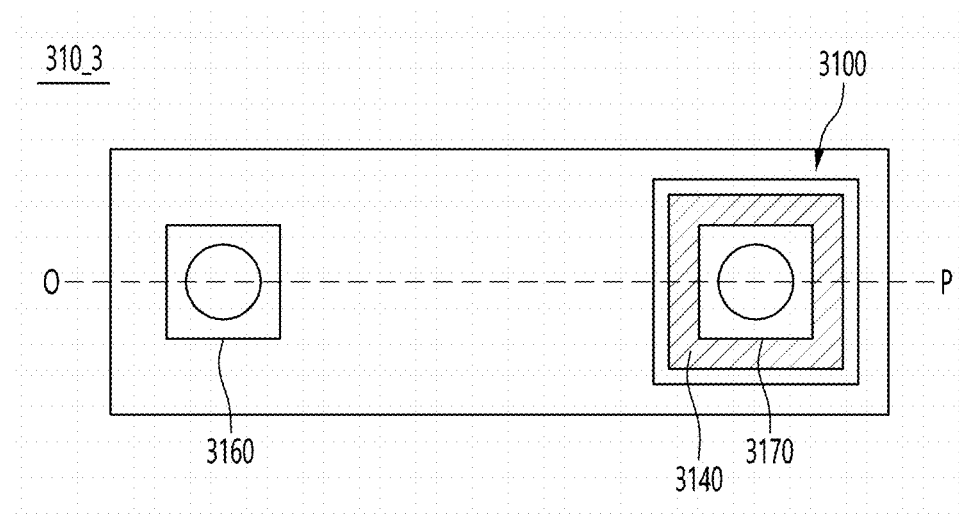
[FIG. 24B]
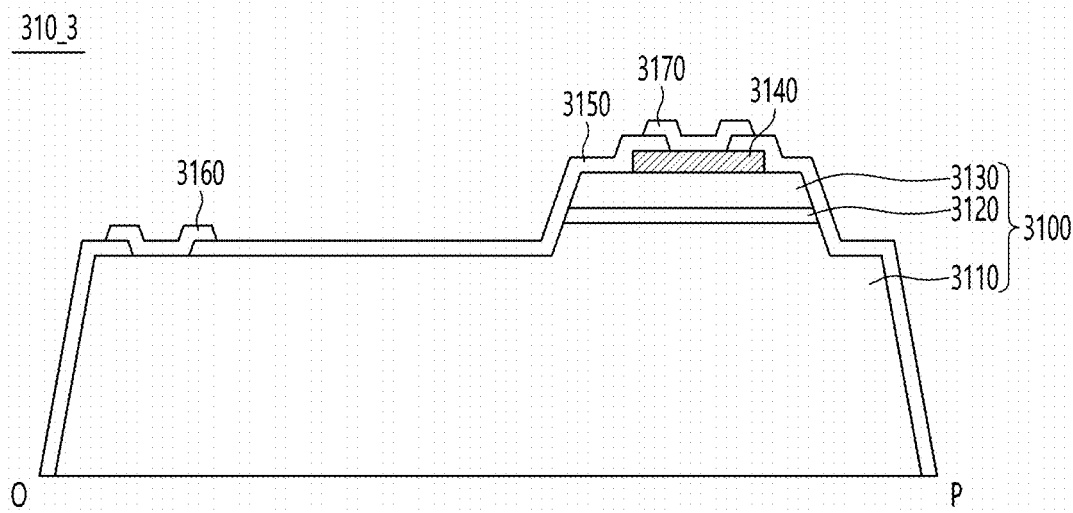

[FIG. 25]
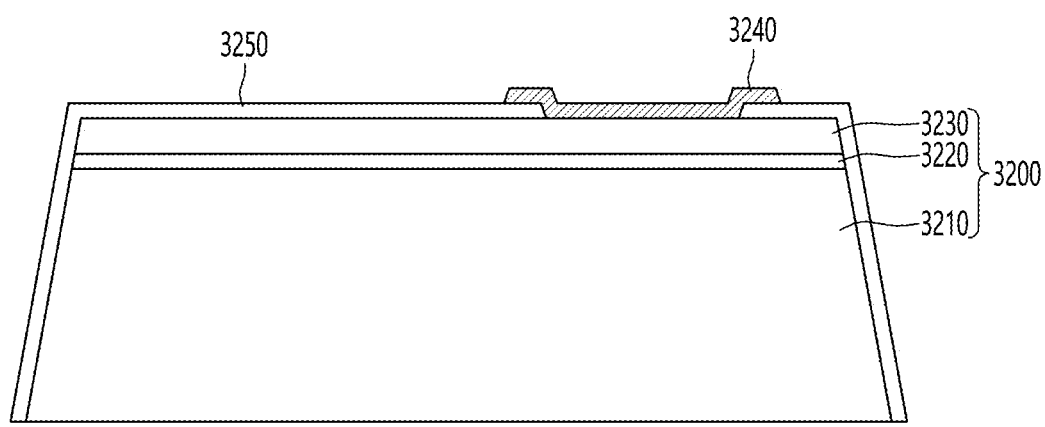
[FIG. 26]
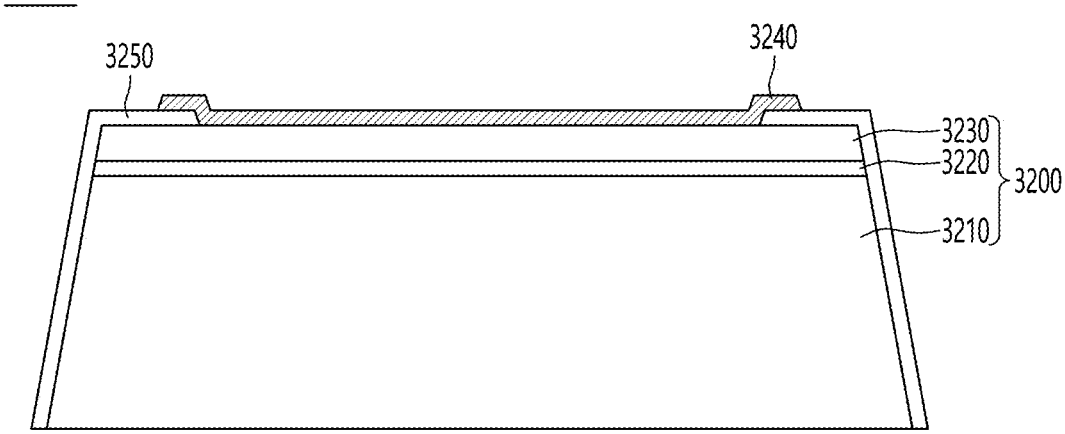

[FIG. 27]
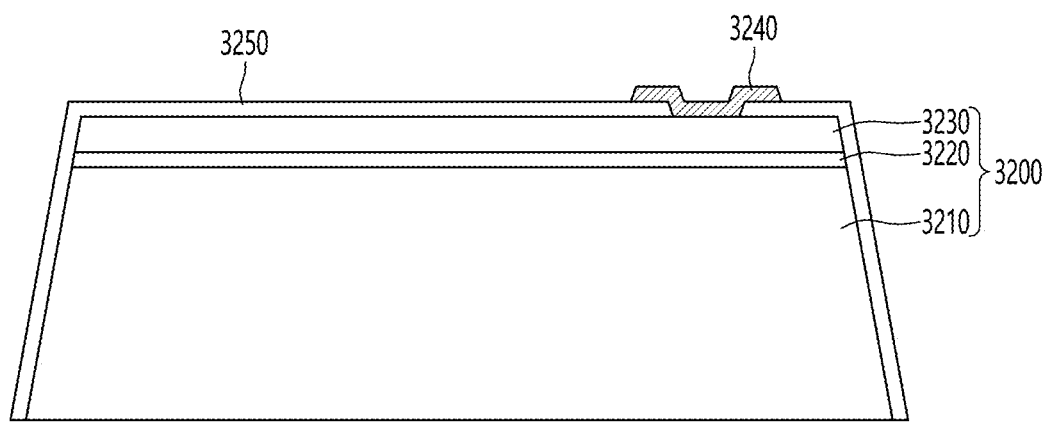
[FIG. 28]
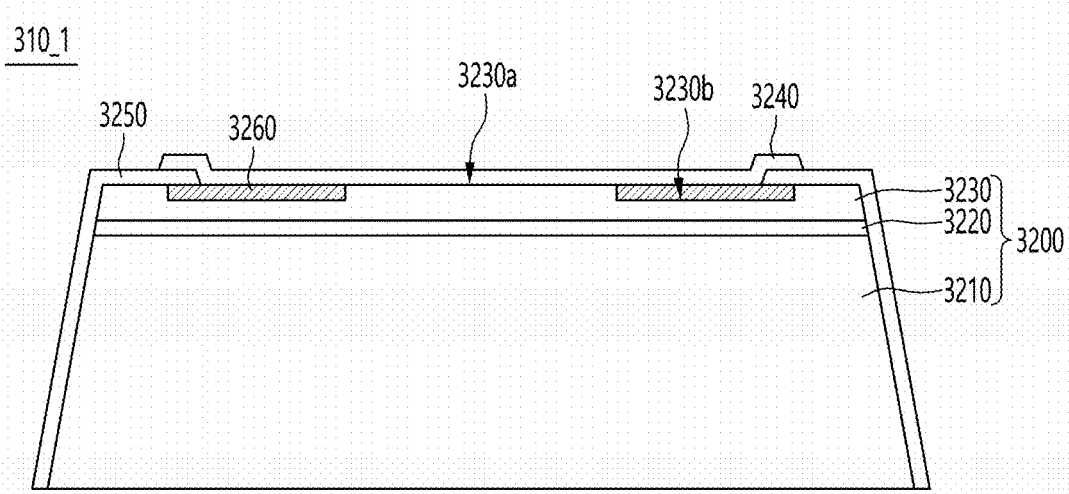

[FIG. 29]
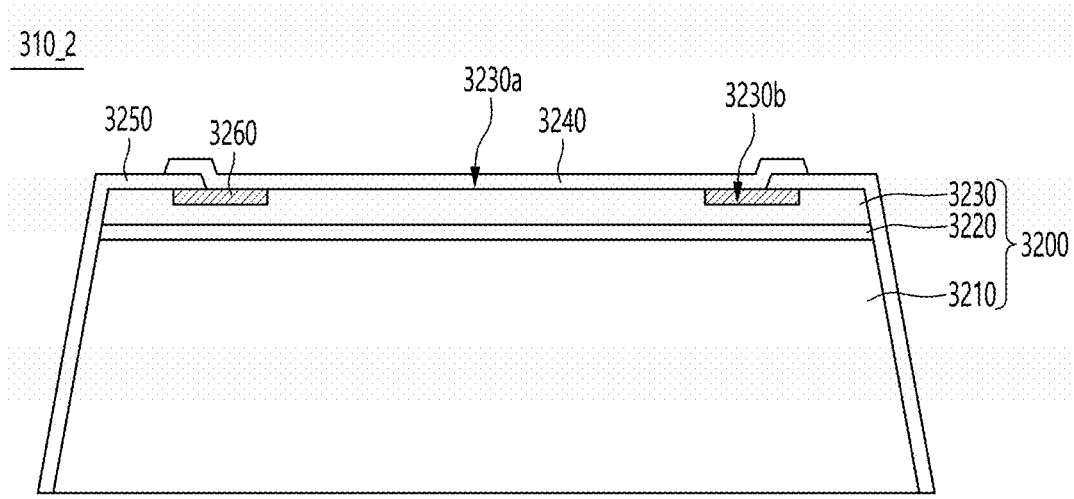
[FIG. 30]
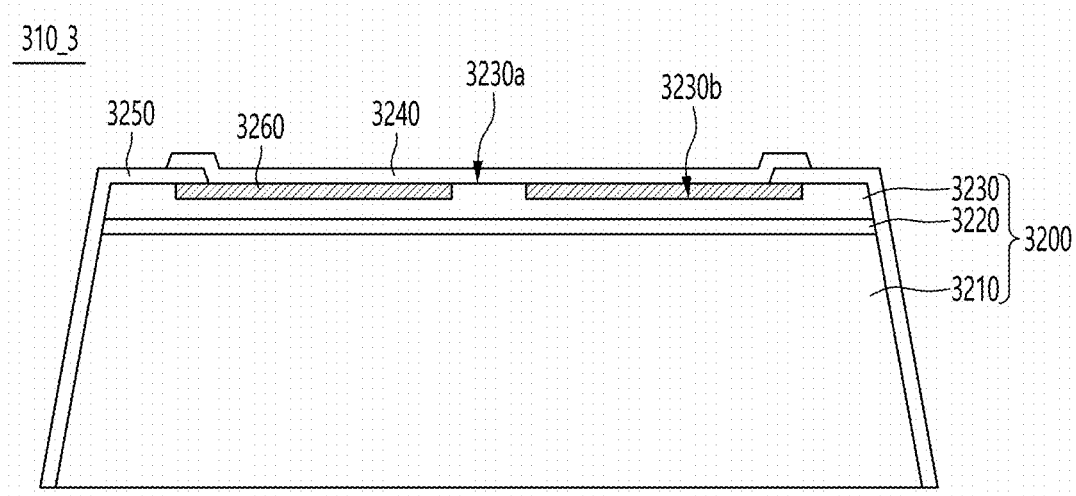

[FIG. 31]
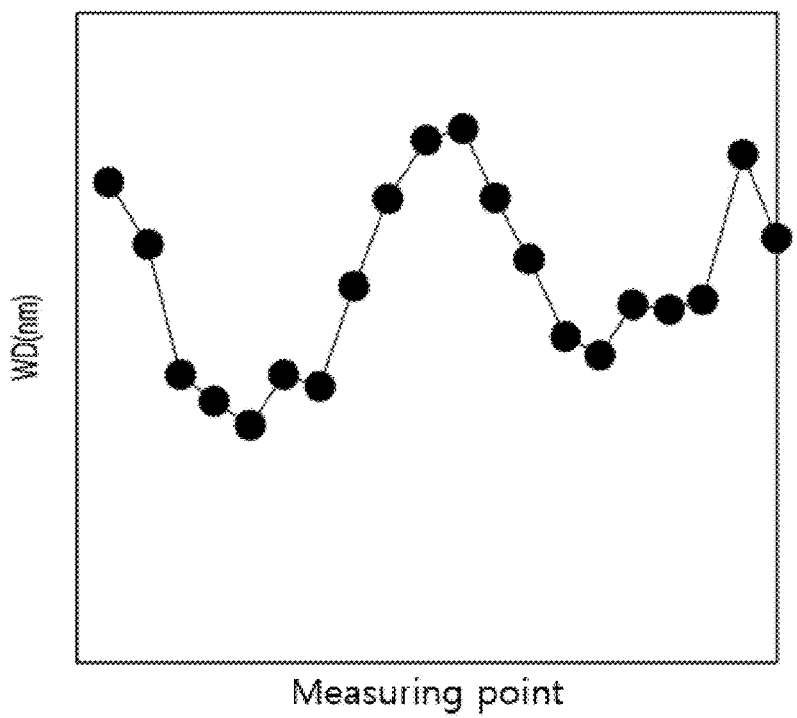
[FIG. 32]
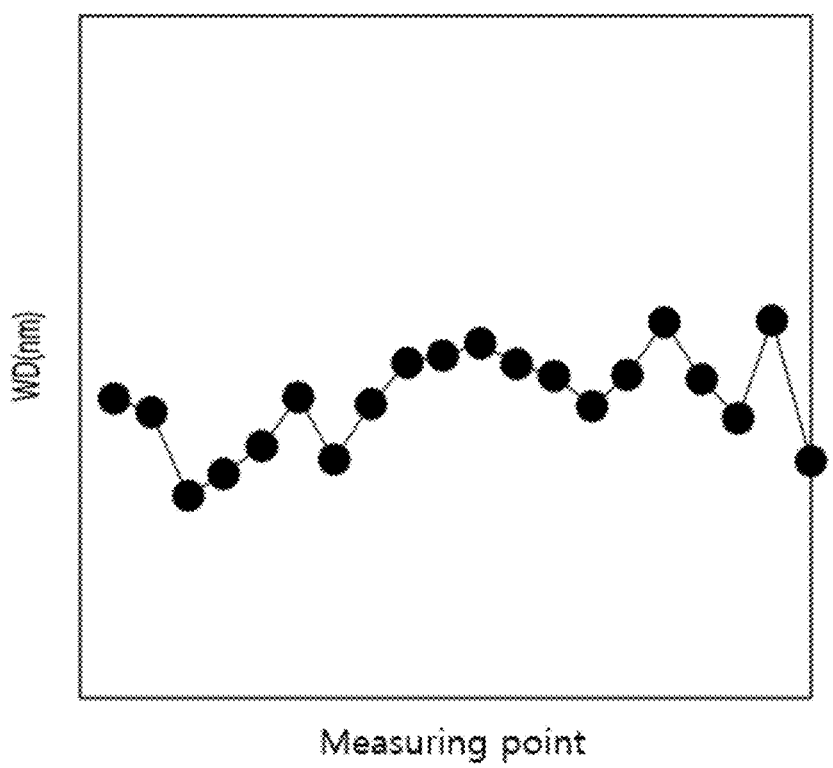

DISPLAY APPARATUS

CROSS-REFERENCE TO RELATED APPLICATION

Pursuant to 35 U.S.C. § 119(a), this application claims the benefit of an earlier filing date of and the right of priority to Korean Application No. 10-2021-0063505, filed in the Republic of Korea on May 17, 2021, the entire contents of which are hereby expressly incorporated by reference into the present application.

BACKGROUND OF THE DISCLOSURE

1. Field of the Disclosure

The embodiment relates to a display device.

2. Background of the Related Art

A display device displays a high-quality image by using a self-luminous device such as a light emitting diode as a light source of a pixel. Light emitting diodes have excellent durability even in harsh environmental conditions, and have a long lifespan and high brightness, so light emitting diodes are spotlighted as a light source for next-generation display devices.

Recently, research has been conducted to fabricate a light emitting device using a highly reliable semiconductor material, and to place it on a panel of a display device (hereinafter referred to as a "display panel"), and to use it as a next-generation pixel light source. For example, in order to supplement a high resolution, the size of the pixel is gradually getting smaller, and the light emitting device needs to be aligned with the pixel of the smaller size. Therefore, research on the manufacture of a micro light emitting device as small as a micro or nano scale is being actively conducted.

A typical display panel contains millions of pixels. Accordingly, since it is very difficult to align the light emitting devices in each of the millions of small pixels, various studies on a method for aligning the light emitting devices in a display panel are being actively conducted in recent years.

As the size of light emitting devices decreases, transferring these light emitting devices onto a substrate is emerging as a very important problem to solve. Transferring technologies that have been recently developed include a pick and place process, a laser lift-off method, or a self-assembly method.

Meanwhile, the light emitting device includes a plurality of semiconductor layers grown by depositing a semiconductor material in a deposition equipment such as MOCVD. For example, during the semiconductor deposition process, different semiconductor materials are deposited on the wafer under high temperature conditions to grow each semiconductor layer. In this case, the temperature conditions for forming each semiconductor layer are different, and the material type of each semiconductor layer is different. In particular, material properties such as a lattice constant of each semiconductor layer can be different from each other. Therefore, when each semiconductor layer is grown, if the temperature conditions are different and material properties such as the lattice constant of each semiconductor layer are different, stress can be generated in the wafer, and the stress can cause the wafer to warp in a specific direction. A larger warpage can be generated according to the intensity of the temperature and the difference in the lattice constant between each semiconductor layer.

As shown in FIGS. 1A and 1, the wafer 20 can be seated on the carrier 10 during the semiconductor deposition process. In general, a plurality of carriers 10 on which the wafer 20 is seated, respectively, revolves and rotates on a stage. The wafer 20 is heated to a desired temperature through the stage and carrier.

As shown in FIG. 1A, the wafer 20 can have a downwardly convex curved shape. For example, the central region of the wafer 20 can be in contact with the carrier 10 due to the high temperature and heat, whereas the edge region of the wafer 20 may not be in contact with the carrier 10.

As shown in FIG. 1B, the wafer 20 can have a curved shape convex upward. For example, the center region of the wafer 20 may not contact the carrier 10 due to the high temperature and heat, whereas the edge region of the wafer 20 can contact the carrier 10.

As shown in FIGS. 1A and 1B, when the wafer 20 is bent, the temperature intensity varies depending on the position of the wafer 20 and there is a difference in lattice constant between the semiconductor layer below and the semiconductor layer currently being grown. In addition, there are regions in which the wafer 20 is in contact with the carrier 10 and regions in which it is not. Accordingly, the thickness of the semiconductor layer varies according to the position of the wafer 20, and a wave deviation can be generated according to the position of the wafer 20 due to an imbalance in the thickness of each semiconductor layer.

As shown in FIGS. 2A and 2B, it can be seen that a wave deviation occurs for each location along the A-B line.

In a typical semiconductor deposition process, as the wafer 20 rotates and orbits during the process, as shown in FIG. 2A, a wave deviation region having concentric bands can be formed. A region having a + deviation or a − deviation based on a deviation of zero along the A-B line can be formed.

When a plurality of semiconductor layers are formed using a semiconductor deposition process, since this warpage inevitably can occur, a wave deviation can be generated between the plurality of light emitting devices manufactured for each region 31 to 35 on the wafer 20 by the semiconductor deposition process. For example, a light emitting device having a deviation of 0 can be manufactured on the regions 32 and 34, a light emitting device having a + deviation can be manufactured on the regions 31 and 35, and a light emitting device having a − deviation can be manufactured on the region 33.

Therefore, conventionally, when a plurality of light emitting devices are manufactured by forming a plurality of semiconductor layers on the wafer 20 using a semiconductor deposition process, it can be impossible to manufacture a plurality of light emitting devices having no wave deviation on the wafer 20.

Meanwhile, a plurality of light emitting devices manufactured from each of at least one or more wafers 20 are disposed on a display substrate to manufacture a display device.

If a wave deviation occurs between a plurality of light emitting devices manufactured due to the warping of the wafer 20 as shown in FIGS. 1A and 1, a mura phenomenon as shown in FIG. 3 can be generated when a display device manufactured using light emitting devices having the wave deviation is driven. Mura phenomenon is a phenomenon in which images are displayed with different colors in each pixel due to wave deviation. This is because the main wave of each of the light emitting devices mounted on each pixel is different from each other due to the wave deviation.

Accordingly, when light of the same main wave is emitted from each of the light emitting devices mounted on each pixel by removing or minimizing the wave deviation, there is no color difference between the pixels, so that the mura phenomenon may not occur.

A method for removing the mura phenomenon in hardware or software in a display device can be proposed. However, for this, since circuit components for removing the mura phenomenon must be provided in the display device, there is a problem in that the cost is increased. In addition, when an algorithm for removing the mura phenomenon is performed in the display device, since a wave deviation between tens of millions of pixels is to be compensated, there is a problem in that a considerable computational load is generated.

Even if the mura phenomenon is removed electronically, for example, hardware or software method, there is a limit to completely removing the mura phenomenon.

SUMMARY OF THE DISCLOSURE

One object of the embodiment is to provide a display device capable of solving the above-mentioned problem and other problems.

Another object of the embodiment is to provide a display device capable of physically removing the mura phenomenon.

Another object of the embodiment is to provide a display device capable of preventing the mura phenomenon in advance by removing or minimizing the wave deviation in the semiconductor light emitting device itself, not the display device.

Another object of the embodiment is to provide a display device capable of reducing cost and computational burden because there is no need to remove the mura phenomenon in hardware or software from the display device.

To achieve the above or other objects, according to an aspect of the embodiment, a display device can include a substrate including a plurality of first sub-pixels, a plurality of second sub-pixels, a plurality of third sub-pixels: a plurality of first semiconductor light emitting devices disposed in the plurality of first sub-pixels to generate a first color light having a first main wave; a plurality of second semiconductor light emitting devices disposed in the plurality of second sub-pixels to generate a second color light having a second main wave; and a plurality of third semiconductor light emitting devices disposed in the plurality of third sub-pixels to generate a third color light having a third main wave. And each of the plurality of first semiconductor light emitting devices can have different light emitting regions to compensate for a wave deviation of the first main wave.

Each of the plurality of second semiconductor light emitting devices can have different light emitting regions to compensate for a wave deviation of the second main wave.

Each of the plurality of third semiconductor light emitting devices can have different light emitting regions to compensate for a wave deviation of the third main wave.

The plurality of first semiconductor light emitting devices can have a first-first semiconductor light emitting device, a first-second semiconductor light emitting device, and a first-third semiconductor light emitting device.

Also, the first-first semiconductor light emitting device can have a first-first light emitting region generating the first color light of the first main wave.

Also, the first-second semiconductor light emitting device can have a first-second light emitting region having an area larger than the first-first light emitting region so that a wave less than the first main wave is compensated for by the first main wave.

Also, the first-third semiconductor light emitting device can have a first-third light emitting region having a smaller area than the first-first light emitting region so that a wave greater than the first main wave is compensated for by the first main wave.

Also, a first-second current density of the first-second emitting region can be less than a first-first current density of the first-first light emitting region, and a first-third current density of the first-third emitting region can be greater than the first-first current density of the first-first emission region.

Also, each area of each of the first-first light emitting region, the first-second light emitting region, and the first-third light emitting region can be 10% to 99% of a size of the first semiconductor light emitting device.

Also, the first semiconductor light emitting device can have an active layer, and each of the first-first light emitting region, the first-second light emitting region, and the first-third light emitting region can be the active layer.

Also, the first semiconductor light emitting device can have an active layer; and a transparent conductive layer on one side of the active layer, and each of the first-first light emitting region, the first-second light emitting region, and the first-third light emitting region can be the transparent conductive layer.

Also, the first semiconductor light emitting device can have a first-first conductivity type semiconductor layer; an active layer on the first-first conductivity type semiconductor layer; a first-second conductivity type semiconductor layer on the active layer; and a contact electrode on the first-second conductivity type semiconductor layer.

Also, each of the first-first light emitting region, the first-second light emitting region, and the first-third light emitting region can be a contact area of the contact electrode in contact with the first-second conductivity type semiconductor layer.

Also, the first semiconductor light emitting device can have a first-first conductive semiconductor layer; an active layer on the first-first conductivity type semiconductor layer; a first-second conductivity type semiconductor layer disposed on the active layer and having a first region and a second region surrounding the first region; and a current blocking layer on the second region of the first-second conductivity type semiconductor layer.

Also, each of the first-first light emitting region, the first-second light emitting region, and the first-third light emitting region can be the first region of the first-second conductivity type semiconductor layer.

Also, each of the first-first semiconductor light emitting device, the first-second semiconductor light emitting device, and the first-third semiconductor light emitting device can be disposed in a sub-pixel corresponding to a position among the plurality of first sub-pixels.

Also, each of the plurality of second semiconductor light emitting devices can have a different light emitting region to compensate for a wave deviation of the second main wave.

Also, the plurality of second semiconductor light emitting devices can have a second-first semiconductor light emitting device, a second-second semiconductor light emitting device, and a second-third semiconductor light emitting device.

Also, the second-first semiconductor light emitting device can have a second-first light emitting region for generating the second color light of the second main wave.

Also, the second-second semiconductor light emitting device can have a second-second light emitting region having a greater area than that of the second-first light emitting region so that a wave less than the second main wave is compensated for by the second main wave.

Also, the second-third semiconductor light emitting device can have a second-third light emitting region having a smaller area than that of the second-first light emitting region so that a wave greater than the second main wave is compensated for by the second main wave.

Also, a second-second current density of the second-second light emitting region can be less than a second-first current density of the second-first light emitting region, and a second-third current density of the second-third light emitting region can be greater than the second-first current density of the second-first light emitting region.

Also, each area of the second-first light emitting area, the second-second light emitting area, and the second-third light emitting area can be 10% to 99% of a size of the second semiconductor light emitting device.

Also, the second semiconductor light emitting device can have an active layer, and each of the second-first light emitting area, the second-second light emitting area, and the second-third light emitting area can be the active layer.

Also, the second semiconductor light emitting device can have an active layer; and a transparent conductive layer on one side of the active layer, and each of the second-first light emitting area, the second-second light emitting area, and the second-third light emitting area can be the transparent conductive layer.

Also, the second semiconductor light emitting device can have a second-first conductive type semiconductor layer; an active layer on the second-first conductive type semiconductor layer; a second-second conductivity type semiconductor layer on the active layer; and a contact electrode on the second-second conductivity type semiconductor layer.

Also, each of the second-first light emitting area, the second-second light emitting area, and the second-third light emitting area can be a contact area of the contact electrode in contact with the second-second conductivity type semiconductor layer.

Also, the second semiconductor light emitting device can have a second-first conductive type semiconductor layer; an active layer on the second-first conductive type semiconductor layer; a second-second conductivity type semiconductor layer disposed on one side of the active layer and having a first region and a second region surrounding the first region; and a current blocking layer on the second region of the second-second conductivity type semiconductor layer.

Also, each of the first-first light emitting region, the first-second light emitting region, and the first-third light emitting region can be the first region of the second-second conductivity type semiconductor layer.

Also, each of the second-first semiconductor light emitting device, the second-second semiconductor light emitting device, and the second-third semiconductor light emitting device can be disposed in a sub-pixel corresponding to a position among the plurality of second sub-pixels.

Also, each of the plurality of third semiconductor light emitting devices can have a different light emitting region to compensate for a wave deviation of the third main wave.

Also, the plurality of third semiconductor light emitting devices can have a third-first semiconductor light emitting device, a third-second semiconductor light emitting device, and a third-third semiconductor light emitting device.

Also, the third-first semiconductor light emitting device can have a third-first light emitting region generating the third color light of the third main wave.

Also, the third-second semiconductor light emitting device can have a third-second light emitting region having a greater area than that of the third-first light emitting region so that a wave less than the third main wave is compensated for by the third main wave.

Also, the third-third semiconductor light emitting device can have a third-third light emitting region having a smaller area than that of the third-first light emitting region so that a wave greater than the third main wave is compensated by the third main wave.

Also, a third-second current density of the third-second light emitting region can be less than a third-first current density of the third-first light emitting region.

Also, a third-third current density of the third-third light emitting region can be greater than the third-first current density of the third-first light emitting region.

Also, each area of the third-first light emitting area, the third-second light emitting area, and the third-third light emitting area can be 10% to 99% of a size of the third semiconductor light emitting device.

Also, the third semiconductor light emitting device can have an active layer, and each of the third-first light emitting area, the third-second light emitting area and the third-third light emitting area can be the active layer.

Also, the third semiconductor light emitting device can have an active layer; and a transparent conductive layer on one side of the active layer, and each of the third-first light emitting area, the third-second light emitting area, and the third-third light emitting area can be the transparent conductive layer.

Also, the third semiconductor light emitting device can have a third-first conductive type semiconductor layer; an active layer on the third-first conductive type semiconductor layer; a third-second conductivity type semiconductor layer on the active layer; and a contact electrode on the third-second conductivity type semiconductor layer.

Also, each of the third-first light-emitting region, the third-second light-emitting region, and the third-third light-emitting region can be a contact area of the contact electrode in contact with the third-second conductivity type semiconductor layer.

Also, the third semiconductor light emitting device can have a third-first conductive type semiconductor layer, an active layer on the third-first conductive type semiconductor layer, a third-second conductivity type semiconductor layer disposed on one side of the active layer and having a first region and a second region surrounding the first region and a current blocking layer on the second region of the third-second conductivity type semiconductor layer.

Also, each of the first-first light-emitting region, the first-second light-emitting region, and the first-third light-emitting region can be the first region of the third-second conductivity type semiconductor layer.

Also, each of the third-first semiconductor light emitting device, the third-second semiconductor light emitting device, and the third-third semiconductor light emitting device can be disposed in a sub-pixel corresponding to a position among the plurality of third sub-pixels.

Also, one of the first color light, the second color light and the third color light is a red light, another can be a green light, and the other is a blue light.

Effects of the Disclosure

The technical effect of the display device according to the embodiment will be described as follows.

According to at least one of the embodiments, even if a wave deviation is generated between a plurality of semiconductor light emitting devices formed on the wafer by bending of the wafer when the plurality of semiconductor layers are grown, the wave deviation can be eliminated or minimized by a post-process. As such, a display device using a semiconductor light emitting device having a minimized wave deviation can be manufactured, so that the mura phenomenon can be prevented.

For example, as shown in FIGS. 19 to 21, the mura phenomenon can be prevented by adjusting the area of the transparent conductive layer 3140 of the semiconductor light emitting devices 310, 320, and 330 as a light emitting region to remove or minimize the wave deviation between the semiconductor light emitting devices 310, 320, and 330.

Also, for example, as shown in FIGS. 22 to 24, the mura phenomenon can be prevented by adjusting the area of the active layer 3120 of the semiconductor light emitting devices 310, 320, and 330 as a light emitting region to remove or minimize a wave deviation between the semiconductor light emitting devices 310, 320, and 330.

Also, for example, as shown in FIGS. 25 to 27, the mura phenomenon can be prevented by adjusting the area of the contact electrode 3240 of the semiconductor light emitting devices 310, 320, and 330 as a light emitting region to remove or minimize a wave deviation between the semiconductor light emitting devices 310, 320, and 330.

Also, for example, as shown in FIGS. 28 to 30, the mura phenomenon can be prevented by adjusting the area of the current blocking layer 3260 of the semiconductor light emitting devices 310, 320, and 330 as the light emitting region to remove or minimize the wave deviation between the semiconductor light emitting devices 310, 320, and 330.

Further scope of applicability of the embodiments will become apparent from the following detailed description. However, it should be understood that the specific embodiments such as the detailed description and preferred embodiments are given by way of example only, since various changes and modifications within the spirit and scope of the embodiments can be clearly understood by those skilled in the art.

BRIEF DESCRIPTION OF THE DRAWINGS

FIG. 1A shows a state in which the wafer has a downwardly convex curved shape.

FIG. 1B shows a state in which the wafer has a curved shape convex upwards.

FIG. 2A is a plan view illustrating a state in which a wave deviation region for each location is formed by a semiconductor deposition process.

FIG. 2B is a diagram showing a wave deviation along line A-B in FIG. 2A.

FIG. 3 is a diagram showing the mura phenomenon.

FIG. 4 illustrates a living room of a house in which the display device 100 according to an embodiment is disposed.

FIG. 5 is a block diagram schematically illustrating a display device according to an embodiment.

FIG. 6 is a circuit diagram illustrating an example of the pixel of FIG. 5.

FIG. 7 is a plan view illustrating the display panel of FIG. 5 in detail.

FIG. 8 is an enlarged view of a first panel area in the display device of FIG. 4.

FIG. 9 is an enlarged view of area A2 of FIG. 8.

FIG. 10 is a view showing an example in which the light emitting device according to the embodiment is assembled on a substrate by a self-assembly method.

FIGS. 11 and 12 are diagrams illustrating an example in which a light emitting device according to an embodiment is transferred to a substrate by a transfer method.

FIG. 13 is a cross-sectional view schematically illustrating the display panel of FIG. 5.

FIG. 14 is a plan view illustrating a display device according to an embodiment.

FIG. 15 shows a wafer including a semiconductor light emitting device.

FIG. 16 shows the wave deviation of the semiconductor light emitting device positioned along line C-D of FIG. 15.

FIG. 17 shows the wave deviation according to the current density.

FIG. 18 shows different light emitting regions of the semiconductor light emitting device.

FIG. 19A is a plan view illustrating a first-first semiconductor light emitting device according to the first embodiment.

FIG. 19B is a cross-sectional view illustrating a first-first semiconductor light emitting device according to the first embodiment.

FIG. 20A is a plan view illustrating a first-second semiconductor light emitting device according to the first embodiment.

FIG. 20B is a cross-sectional view illustrating a first-second semiconductor light emitting device according to the first embodiment.

FIG. 21A is a plan view illustrating a first-third semiconductor light emitting device according to the first embodiment.

FIG. 21B is a cross-sectional view illustrating a first-third semiconductor light emitting device according to the first embodiment.

FIG. 22A is a plan view illustrating a first-first semiconductor light emitting device according to a second embodiment.

FIG. 22B is a cross-sectional view illustrating a first-first semiconductor light emitting device according to the second embodiment.

FIG. 23A is a plan view illustrating a first-second semiconductor light emitting device according to a second embodiment.

FIG. 23B is a cross-sectional view illustrating a first-second semiconductor light emitting device according to the second embodiment.

FIG. 24A is a plan view illustrating a first-third semiconductor light emitting device according to a second embodiment.

FIG. 24B is a cross-sectional view illustrating a first-third semiconductor light emitting device according to a second embodiment.

FIG. 25 is a cross-sectional view illustrating a first-first semiconductor light emitting device according to a third embodiment.

FIG. 26 is a cross-sectional view illustrating a first-second semiconductor light emitting device according to a third embodiment.

FIG. 27 is a cross-sectional view illustrating a first-third semiconductor light emitting device according to a third embodiment.

FIG. 28 is a cross-sectional view illustrating a first-first semiconductor light emitting device according to the fourth embodiment.

FIG. 29 is a cross-sectional view illustrating a first-second semiconductor light emitting device according to a fourth embodiment.

FIG. 30 is a cross-sectional view illustrating a first-third semiconductor light emitting device according to a fourth embodiment.

FIG. 31 shows the wave deviation of the semiconductor light emitting device according to the position of the wafer in the related art.

FIG. 32 illustrates a wave deviation of a semiconductor light emitting device for each position of a wafer according to an embodiment.

DETAILED DESCRIPTION OF THE DISCLOSURE

Hereinafter, the embodiments disclosed in the present specification will be described in detail with reference to the accompanying drawings, but the same or similar components are given the same reference numerals regardless of the reference numerals, and the redundant description thereof will be omitted. The suffixes "module" and "part" for components used in the following description are given or mixed in consideration of only the ease of writing the specification, and do not have a meaning or role distinct from each other by themselves. In addition, the accompanying drawings are provided for easy understanding of the embodiments disclosed in the present specification, and the technical spirit disclosed in the present specification is not limited by the accompanying drawings. Also, when an element, such as a layer, region, or substrate, is referred to as being 'on' another component, this includes that it is directly on the other element or there can be other intermediate elements in between.

The display device described in this specification can include a mobile phone, a smart phone, a laptop computer, terminals for digital broadcasting, a PDA (personal digital assistants), a PMP (portable multimedia player), a navigation, a Slate PC, a Tablet PC, an Ultrabook, a Digital TV, a Desktop Computer, etc. However, the configuration according to the embodiment described in the present specification can be applied to a display capable device even if it is a new product form to be developed later.

Hereinafter, a light emitting device according to an embodiment and a display device including the same will be described.

FIG. 4 shows a living room of a house in which the display device 100 according to the embodiment is disposed.

The display device 100 of the embodiment can display the status of various electronic products such as a washing machine 101, a robot cleaner 102, and an air purifier 103, and can communicate with each electronic product based on IOT, and can control each electronic product based on user's setting data.

The display device 100 according to the embodiment can include a flexible display manufactured on a thin and flexible substrate. The flexible display can be bent or rolled like paper while maintaining the characteristics of the conventional flat panel display.

In the flexible display, visual information can be implemented by independently controlling the light emission of unit pixels arranged in a matrix form. A unit pixel means a minimum unit for supplementing one color. The unit pixel of the flexible display can be implemented by a light emitting device. In an embodiment, the light emitting device can be a Micro-LED or a Nano-LED, but is not limited thereto.

FIG. 5 is a block diagram schematically showing a display device according to an embodiment, and FIG. 6 is a circuit diagram showing an example of the pixel of FIG. 5

Referring to FIGS. 5 and 6, the display device according to the embodiment can include a display panel 10, a driving circuit 20, a scan driver 30, and a power supply circuit 50.

The display device 100 according to the embodiment can drive the light emitting device in an active matrix (AM) method or a passive matrix (PM, passive matrix) method.

The driving circuit 20 can include a data driver 21 and a timing controller 22.

The display panel 10 can have a rectangular shape, but is not limited thereto. For example, the display panel 10 can be formed in a circular or oval shape. At least one side of the display panel 10 can be bent to a predetermined curvature.

The display panel 10 can be divided into a display area DA and a non-display area NDA disposed around the display area DA. The display area DA is an area in which pixels PX are formed to display an image. The display panel 10 can include data lines (D1 to Dm, m is an integer greater than or equal to 2), scan lines crossing the data lines D1 to Dm (S1 to Sn, n is an integer greater than or equal to 2), the high-potential voltage line supplied with the high-voltage, the low-potential voltage line supplied with the low-potential voltage, and the pixels PX connected to the data lines D1 to Dm and the scan lines S1 to Sn can be included.

Each of the pixels PX can include a first sub-pixel PX1, a second sub-pixel PX2, and a third sub-pixel PX3. The first sub-pixel PX1 emits a first color light of a first wave, the second sub-pixel PX2 emits a second color light of a second wave, and the third sub-pixel PX3 emits a third color light of a third wave. The first color light can be red light, the second color light can be green light, and the third color light can be blue light, but is not limited thereto. Also, although it is illustrated that each of the pixels PX can include three sub-pixels in FIG. 2, the present invention is not limited thereto. For example, each of the pixels PX can include four or more sub-pixels.

Each of the first sub-pixel PX1, the second sub-pixel PX2, and the third sub-pixel PX3 can connected to at least one of the data lines D1 to Dm, and at least one of the scan lines S1 to Sn, and a high potential voltage line. As shown in FIG. 3, the first sub-pixel PX1 can include the light emitting devices LD, plurality of transistors for supplying current to the light emitting devices LD, and at least one capacitor Cst.

Each of the first sub-pixel PX1, the second sub-pixel PX2, and the third sub-pixel PX3 can include only one light emitting device LD and at least one capacitor Cst.

Each of the light emitting devices LD can be a semiconductor light emitting diode including a first electrode, a plurality of conductivity type semiconductor layers, and a second electrode. Here, the first electrode can be an anode electrode and the second electrode can be a cathode electrode The plurality of transistors can include a driving transistor DT for supplying current to the light emitting devices LD as shown in FIG. 6 and a scan transistor ST for supplying a data voltage to the gate electrode of the driving transistor DT. The driving transistor DT can include a gate electrode connected to the source electrode of the scan transistor ST, a source electrode connected to a high potential voltage line to which a high potential voltage is applied, and a drain electrode connected to first electrodes of the light emitting devices LD. The scan transistor ST can include a gate electrode connected to the scan line Sk, where k is an integer satisfying 1≤k≤n, a source electrode connected to the gate electrode of the driving transistor DT, and a drain electrode connected to data lines Dj, where j is integer satisfying $1 \leq j \leq m$.

The capacitor Cst is formed between the gate electrode and the source electrode of the driving transistor DT. The storage capacitor Cst can charge a difference between the gate voltage and the source voltage of the driving transistor DT.

The driving transistor DT and the scan transistor ST can be formed of a thin film transistor. In addition, although the driving transistor DT and the scan transistor ST have been mainly described in FIG. 6 as being formed of a P-type MOSFET (Metal Oxide Semiconductor Field Effect Transistor), the present invention is not limited thereto. The driving transistor DT and the scan transistor ST can be formed of an N-type MOSFET. In this case, the positions of the source electrode and the drain electrode of each of the driving transistor DT and the scan transistor ST can be changed.

Also, in FIG. 6, it is illustrated as each of the first sub-pixel PX1, the second sub-pixel PX2, and the third sub-pixel PX3 can include one driving transistor DT, one scan transistor ST, and 2T1C (2 Transistor-1 capacitor) having a capacitor Cst, but the present invention is not limited thereto. Each of the first sub-pixel PX1, the second sub-pixel PX2, and the third sub-pixel PX3 can include a plurality of scan transistors ST and a plurality of capacitors Cst.

Since the second sub-pixel PX2 and the third sub-pixel PX3 can be represented by substantially the same circuit diagram as the first sub-pixel PX1, a detailed description thereof will be omitted.

The driving circuit 20 outputs signals and voltages for driving the display panel 10. To this end, the driving circuit 20 can include a data driver 21 and a timing controller 22.

The data driver 21 receives digital video data and a source control signal DCS from the timing controller 22. The data driver 21 converts the digital video data into analog data voltages according to the source control signal DCS and supplies them to the data lines D1 to Dm of the display panel 10.

The timing controller 22 receives digital video data DATA and timing signals from the host system. The timing signals can include a vertical sync signal, a horizontal sync signal, a data enable signal, and a dot clock. The host system can be an application processor of a smartphone or tablet PC, a monitor, or a system-on-chip of a TV.

The timing controller 22 can generate control signals for controlling the operation timings of the data driver 21 and the scan driver 30. The control signals can include a source control signal DCS for controlling an operation timing of the data driver 21 and a scan control signal SCS for controlling an operation timing of the scan driver 30.

The driving circuit 20 can be disposed in the non-display area NDA provided on one side of the display panel 10. The driving circuit 20 can be formed of an integrated circuit (IC) and can be mounted on the display panel 10 by a chip on glass (COG) method, a chip on plastic (COP) method, or an ultrasonic bonding method, but the present invention is not limited thereto. For example, the driving circuit 20 can be mounted on a circuit board instead of the display panel 10.

The data driver 21 can be mounted on the display panel 10 by a chip on glass (COG) method, a chip on plastic (COP) method, or an ultrasonic bonding method, and the timing controller 22 can be mounted on a circuit board.

The scan driver 30 can receive the scan control signal SCS from the timing controller 22. The scan driver 30 can generate scan signals according to the scan control signal SCS and supplies them to the scan lines S1 to Sn of the display panel 10. The scan driver 30 can include a plurality of transistors and can be formed in the non-display area NDA of the display panel 10. Also, the scan driver 30 can be formed of an integrated circuit, and in this case, can be mounted on a gate flexible film attached to the other side of the display panel 10.

The circuit board can be attached on pads provided on one edge of the display panel 10 using an anisotropic conductive film. Due to this, the lead lines of the circuit board can be electrically connected to the pads. The circuit board can be a flexible film such as a flexible printed circuit board, a printed circuit board or a chip on film. The circuit board can be bent under the display panel 10. For this reason, one side of the circuit board can be attached to one edge of the display panel 10, and the other side can be disposed under the display panel 10 to be connected to a system board on which a host system is mounted.

The power supply circuit 50 can generate voltages necessary for driving the display panel 10 from the main power applied from the system board and supply the voltages to the display panel 10. For example, the power supply circuit 50 can generate a high potential voltage VDD and a low potential voltage VSS for driving the light emitting devices LD of the display panel 10 from the main power source, and can supply the high potential voltage line and the low potential voltage line of the display panel 10.

FIG. 7 is a plan view showing the display panel of FIG. 5 in detail. In the FIG. 7, for convenience of description, Data pads DP1 to DPp, where p is an integer greater than or equal to 2), floating pads FP1 and FP2, power pads PP1 and PP2, floating lines FL1 and FL2, low potential voltage line VSSL, data lines D1 to Dm, the first pad electrodes 210 and the second pad electrodes 220 are illustrated.

Referring to FIG. 7, data lines D1 to Dm, first pad electrodes 210, second pad electrodes 220, and pixels PX can be disposed in the display area DA of the display panel 10.

The data lines D1 to Dm can extend long in the second direction (Y-axis direction). One side of the data lines D1 to Dm can be connected to the driving circuit 20 (of FIG. 5). Accordingly, the data voltages of the driving circuit 20 can be applied to the data lines D1 to Dm.

The first pad electrodes 210 can be disposed to be spaced apart from each other at a predetermined interval in the first direction (X-axis direction). Accordingly, the first pad electrodes 210 may not overlap the data lines D1 to Dm. Among the first pad electrodes 210, the first pad electrodes 210 disposed at the right edge of the display area DA can be connected to the first floating line FL1 in the non-display area NDA.

Each of the second pad electrodes 220 can extend in a first direction (X-axis direction). Accordingly, the second pad electrodes 220 can overlap the data lines D1 to Dm. Also, the second pad electrodes 220 can be connected to the low potential voltage line VSSL in the non-display area NDA. Accordingly, the low potential voltage of the low potential voltage line VSSL can be applied to the second pad electrodes 220.

In the non-display area NDA of the display panel 10, a pad part PA, a driving circuit 20, a first floating line FL1, a second floating line FL2, and a low potential voltage line VSSL can be disposed. The pad part PA can include data pads DP1 to DPp, floating pads FP1 and FP2, and power pads PP1 and PP2.

The pad part PA can be disposed on one edge of the display panel 10, for example, a lower edge. The data pads DP1 to DPp, the floating pads FP1 and FP2, and the power pads PP1 and PP2 can be disposed in parallel in the first direction (X-axis direction) in the pad part PA.

A circuit board can be attached to the data pads DP1 to DPp, the floating pads FP1 and FP2, and the power pads PP1 and PP2 using an anisotropic conductive film. Accordingly, the circuit board and the data pads DP1 to DPp, the floating pads FP1 and FP2, and the power pads PP1 and PP2 can be electrically connected to each other.

The driving circuit 20 can be connected to the data pads DP1 to DPp through link lines. The driving circuit 20 can receive digital video data DATA and timing signals through the data pads DP1 to DPp. The driving circuit 20 can convert the digital video data DATA into analog data voltages and supply the converted digital video data DATA to the data lines D1 to Dm of the display panel 10.

The low potential voltage line VSSL can be connected to the first power pad PP1 and the second power pad PP2 of the pad part PA. The low potential voltage line VSSL can extend long in the second direction (Y-axis direction) in the non-display area NDA at the left outer side and the right outer side of the display area DA. The low potential voltage line VSSL can be connected to the second pad electrode 220. Due to this, the low potential voltage of the power supply circuit 50 can be applied to the second pad electrode 220 through the circuit board, the first power pad PP1, the second power pad PP2, and the low potential voltage line VSSL.

The first floating line FL1 can be connected to the first floating pad FP1 of the pad part PA. The first floating line FL1 can extend long in the second direction (Y-axis direction) in the non-display area NDA on the left and right sides of the display area DA. The first floating pad FP1 and the first floating line FL1 can be a dummy pad and a dummy line to which no voltage is applied.

The second floating line FL2 can be connected to the second floating pad FP2 of the pad part PA. The first floating line FL1 can extend long in the second direction (Y-axis direction) in the non-display area NDA on the left and right sides of the display area DA. The second floating pad FP2 and the second floating line FL2 can be a dummy pad and a dummy line to which no voltage is applied.

Meanwhile, since the light emitting devices LDs (of FIG. 6) have a very small size, it is very difficult to mount on the first sub-pixel PX1, the second sub-pixel PX2, and the third sub-pixel PX3 of each of the pixels PXs.

To solve this problem, an alignment method using a dielectrophoresis method has been proposed.

For example, during the manufacturing process of the display panel 10, in order to align the light emitting devices 310, 320, and 330 (of FIG. 14), an electric field can be formed in the first sub-pixel PX1, the second sub-pixel PX2, and the third sub-pixel PX3 of each of the pixels PXs. Specifically, by applying a dielectrophoretic force to the light emitting devices 310, 320, 330 using a dielectrophoretic method during the manufacturing process, the light emitting devices 310, 320, and 330 can be aligned in each of the first sub-pixel PX1, the second sub-pixel PX2, and the third sub-pixel PX3.

However, it is difficult to apply a ground voltage to the first pad electrodes 210 by driving the thin film transistors during the manufacturing process.

Therefore, in the completed display device, the first pad electrodes 210 can be disposed spaced apart from each other at a predetermined interval in the first direction (X-axis direction). But, during the manufacturing process, the first pad electrodes 210 can be disposed to extend long without being disconnected in the first direction (X-axis direction).

Accordingly, during the manufacturing process, the first pad electrodes 210 can be connected to the first floating line FL1 and the second floating line FL2. Therefore, the first pad electrodes 210 can receive a ground voltage through the first floating line FL1 and the second floating line FL2. Therefore, after aligning the light emitting devices 310, 320, and 330 using the dielectrophoretic method during the manufacturing process, by disconnecting the first pad electrodes 210, the first pad electrodes 210 can be disposed to be spaced apart from each other at a predetermined interval in the first direction (X-axis direction).

Meanwhile, the first floating line FL1 and the second floating line FL2 are lines for applying a ground voltage during a manufacturing process, and no voltage can be applied to the completed display device. Alternatively, a ground voltage can be applied to the first floating line FL1 and the second floating line FL2 to prevent static electricity in the completed display device or to drive the light emitting devices 310, 320, and 330.

FIG. 8 is an enlarged view of a first panel area in the display device of FIG. 4.

Referring to FIG. 8, the display device 100 according to the embodiment can be manufactured by mechanically and electrically connecting a plurality of panel areas such as the first panel area A1 by tiling.

The first panel area A1 can include a plurality of light emitting devices 150 arranged for each unit pixel PX (in FIG. 5).

For example, the unit pixel PX can include a first sub-pixel PX1, a second sub-pixel PX2, and a third sub-pixel PX3. For example, a plurality of red light emitting devices 150R can be disposed in the first sub-pixel PX1, A plurality of green light emitting devices 150G can be disposed in the second sub-pixel PX2, and a plurality of blue light emitting devices 150B can be disposed in the third sub-pixel PX3. The unit pixel PX can further include a fourth sub-pixel in which a light emitting device is not disposed, but is not limited thereto.

Meanwhile, the light emitting device 150 can be the semiconductor light emitting device 310, 320, 330 of FIG. 14. For example, the first semiconductor light emitting device 310 can be a red light emitting device 150R, the second semiconductor light emitting device 320 can be a green light emitting device 150G, and the third semiconductor light emitting device 330 can be a blue light emitting device 150B.

FIG. 9 is an enlarged view of area A2 of FIG. 8.

Referring to FIG. 9, the display device 100 according to the embodiment can include a substrate 200, wiring electrodes 201 and 202, an insulating layer 206, and a plurality of light emitting devices 150 and more components can be included.

The wiring electrode can include a first wiring electrode 201 and a second wiring electrode 202 spaced apart from each other. The first wire electrode 201 and the second wire electrode 202 can be provided to generate a dielectrophoretic force to assemble the light emitting device 150.

The light emitting device 150 can include a red light emitting device 150, a green light emitting device 150G, and a blue light emitting device 150B0 to form a sub-pixel, respectively. However, the present invention is not limited thereto, and red and green can be implemented by providing a red phosphor and a green phosphor, respectively.

The substrate 200 can be formed of glass or polyimide. Also, the substrate 200 can include a flexible material such as polyethylene naphthalate (PEN) or polyethylene terephthalate (PET). In addition, the substrate 200 can be made of a transparent material, but is not limited thereto.

The insulating layer 206 can include an insulating and flexible material such as polyimide, PEN, PET, etc., and can be integrally formed with the substrate 200 to form one substrate.

The insulating layer 206 can be a conductive adhesive layer having adhesiveness and conductivity, and the conductive adhesive layer can have flexibility to enable a flexible function of the display device. For example, the insulating layer 206 can be an anisotropy conductive film (ACF) or a conductive adhesive layer such as an anisotropic conductive medium or a solution containing conductive particles. The conductive adhesive layer can be a layer that is electrically conductive in a direction perpendicular to the thickness but electrically insulating in a direction horizontal to the thickness.

The insulating layer 206 can include an assembly hole 203 through which the light emitting device 150 is inserted. Accordingly, during self-assembly, the light emitting device 150 can be easily inserted into the assembly hole 203 of the insulating layer 206. The assembly hole 203 can be referred to as an insertion hole, a fixing hole, an alignment hole, or the like.

Meanwhile, a method of mounting the light emitting device 150 on the substrate 200 can include, for example, a self-assembly method (refer to FIG. 10) and a transfer method (refer to FIGS. 11 and 12.

FIG. 10 is a view showing an example in which a light emitting device according to an embodiment is assembled on a substrate by a self-assembly method.

A self-assembly method of the light emitting device will be described with reference to FIGS. 9 and 10.

The substrate 200 can be a panel substrate of the display device. In the following description, the substrate 200 will be described as a panel substrate of the display device, but the embodiment is not limited thereto.

The substrate 200 can be formed of glass or polyimide. Also, the substrate 200 can include a flexible material such as polyethylene naphthalate (PEN) or polyethylene terephthalate (PET). Also, the substrate 200 can be made of a transparent material, but is not limited thereto.

Referring to FIG. 10, the light emitting device 150 can be introduced into a chamber 1300 filled with a fluid 1200. The fluid 1200 can be water such as ultrapure water, but is not limited thereto. A chamber can be referred to as a water bath, container, vessel, or the like.

After that, the substrate 200 can be disposed on the chamber 1300. According to an embodiment, the substrate 200 can be introduced into the chamber 1300.

As shown in FIG. 9, a pair of wiring electrodes 201 and 202 corresponding to each of the light emitting devices 150 to be assembled can be disposed on the substrate 200.

The wiring electrodes 201 and 202 can be formed of a transparent electrode (ITO) or include a metal material having excellent electrical conductivity. For example, the wiring electrodes 201 and 202 can be formed of at least one of titanium (Ti), chromium (Cr), nickel (Ni), aluminum (Al), platinum (Pt), gold (Au), tungsten (W), molybdenum (Mo) or an alloy thereof.

In the wiring electrodes 201 and 202, an electric field is formed by an externally supplied voltage, and a dielectrophoretic force can be formed between the wiring electrodes 201 and 202 by this electric field. The light emitting device 150 can be fixed to the assembly hole 203 on the substrate 200 by this dielectrophoretic force.

The distance between the wiring electrodes 201 and 202 is formed to be smaller than the width of the light emitting device 150 and the width of the assembly hole 203, so that the assembly position of the light emitting device 150 using an electric field can be more precisely fixed.

An insulating layer 206 is formed on the wiring electrodes 201 and 202 to protect the wiring electrodes 201 and 202 from the fluid 1200 and to prevent leakage of current flowing through the wiring electrodes 201 and 202.

In addition, the insulating layer 206 can include an insulating and flexible material such as polyimide, PEN, PET, etc., and can be integrally formed with the substrate 200 to form one substrate.

The insulating layer 206 can be an insulating layer having adhesive properties, or can be a conductive adhesive layer having conductivity. The insulating layer 206 can be flexible to enable a flexible function of the display device.

The insulating layer 206 has a barrier wall, and an assembly hole 203 can be formed by the barrier wall. For example, when the substrate 200 is formed, a portion of the insulating layer 206 is removed, so that each of the light emitting devices 150 can be assembled into the assembly hole 203 of the insulating layer 206.

An assembly hole 203 to which the light emitting devices 150 are coupled is formed in the substrate 200, and the surface on which the assembly hole 203 is formed can contact the fluid 1200. The assembly hole 203 can guide an accurate assembly position of the light emitting device 150.

Meanwhile, the assembly hole 203 can have a shape and a size corresponding to the shape of the light emitting device 150 to be assembled at a corresponding position. Accordingly, it is possible to prevent assembling other light emitting devices or assembling a plurality of light emitting devices in the assembly hole 203.

Referring back to FIG. 10, after the substrate 200 is disposed, the assembly apparatus 1100 including a magnetic material can move along the substrate 200. As a magnetic material, for example, a magnet or an electromagnet can be used. The assembling apparatus 1100 can move while in contact with the substrate 200 in order to maximize the area applied by the magnetic field into the fluid 1200. According to an embodiment, the assembling apparatus 1100 can include a plurality of magnetic materials or a magnetic material having a size corresponding to that of the substrate 200. In this case, the moving distance of the assembly apparatus 1100 can be limited within a predetermined range.

The light emitting device 150 in the chamber 1300 can move toward the assembling device 1100 by the magnetic field generated by the assembling device 1100.

The light emitting device 150 can enter the assembly hole 203 and come into contact with the substrate 200 while moving toward the assembly apparatus 1100.

At this time, it can be prevented that the light emitting device 150 in contact with the substrate 200 is separated by the movement of the assembly apparatus 1100 by the electric field applied by the wiring electrodes 201 and 202 formed on the substrate 200.

For example, by the self-assembly method using the above-described electromagnetic field, the time required for each of the light emitting devices 150 to be assembled on the substrate 200 can be rapidly reduced, so that a large-area high-pixel display can be implemented more quickly and economically.

A predetermined solder layer 225 can be further formed between the light emitting device 150 assembled on the assembly hole 200 of the substrate 200 and the second pad electrode 222 to improve the bonding force of the light emitting device 150.

Thereafter, the first pad electrode 221 can be connected to the light emitting device 150 to apply power.

Next, a molding layer 230 can be formed in the barrier wall 200S and the assembly hole 203 of the substrate 200. The molding layer 230 can be a transparent resin or a lane including a reflective material and a scattering material.

FIGS. 11 and 12 are diagrams illustrating an example in which a light emitting device according to an embodiment is transferred to a substrate by a transfer method.

As shown in FIG. 10, a plurality of light emitting devices 150 can be attached to a substrate 1500. For example, the substrate 1500 can be a donor substrate as an intermediate medium for mounting the light emitting device 150 on the display substrate. In this case, the plurality of light emitting devices 150 manufactured on the wafer can be attached to the substrate 1500, and the plurality of light emitting devices 150 attached to the substrate 1500 can be transferred onto the display substrate.

Hereinafter, the substrate 1500 as a donor substrate will be described, but the substrate 1500 can be a display substrate to which the plurality of light emitting devices 150 are directly transferred without passing through the donor substrate.

As shown in FIG. 11, after the substrate 1500 is positioned on the display substrate 200, an alignment process can be performed so that each of the plurality of light emitting devices 150 on the substrate 1500 corresponds to each pixel of the display substrate 200.

Thereafter, by pressing the substrate 1500 (or the substrate 200 for display), the plurality of light emitting devices 150 on the substrate 1500 can be transferred to each pixel on the substrate 200 for display.

Thereafter, a plurality of light emitting devices 150 are attached to the display substrate 200 through a post-process and the plurality of light emitting devices 150 are electrically connected to a power source, so that the plurality of light emitting devices 150 emit light to display an image.

Meanwhile, in the display device according to the embodiment, an image can be displayed using a light emitting device. The light emitting device of the embodiment is a self-emitting device that emits light by itself by application of electricity, and can be a semiconductor light emitting device. Since the light emitting device of the embodiment is made of an inorganic semiconductor material, it is resistant to deterioration and has a semi-permanent lifespan, thereby providing stable light, thereby contributing to the supplementation of high-quality and high-definition images in the display device.

For example, the display device can display an image by using a light emitting element as a light source and having a color generating unit on the light emitting element (refer to FIG. 13).

The display device can display the projection through a display panel in which each of a plurality of light emitting devices generating different color light is disposed in a pixel.

FIG. 13 is a cross-sectional view schematically illustrating the display panel of FIG. 5.

Referring to FIG. 13, the display panel 10 according to the embodiment can include a first substrate 40, a light emitting unit 41, a color generating unit 42, and a second substrate 46. The display panel 10 of the embodiment can include more components than this, but is not limited thereto. The first substrate 40 can be the substrate 200 illustrated in FIG. 9.

At least one insulating layer can be disposed between the first substrate 40 and the light emitting unit 41, between the light emitting unit 41 and the color generating unit 42 and/or between the color generating unit 42 and the second substrate 46, but, the present invention is not limited thereto.

The first substrate 40 can support the light emitting unit 41, the color generating unit 42, and the second substrate 46. The first substrate 40 can include various elements as described above, for example, data lines D1 to Dm, m is an integer of 2 or more, scan lines S1 to Sn, a high potential voltage line and a low potential voltage line as shown in FIG. 5. Also, the first substrate 40 can include a plurality of transistors ST and DT and at least one capacitor Cst as shown in FIG. 6. Also, the first substrate 40 can include a first pad electrode 210 and a second pad electrode 220 as shown in FIG. 7.

The first substrate 40 can be formed of glass or a flexible material, but is not limited thereto.

The light emitting unit 41 can provide light to the color generating unit 42. The light emitting unit 41 can include a plurality of light sources that emit light by themselves by application of electricity. For example, the light source can include a light emitting device (150 in FIGS. 8 and 310, 320, 330 in FIG. 14).

For example, the plurality of light emitting devices 150 can be separately arranged for each sub-pixel of a pixel, and can emit light independently under the control of each individual sub-pixel.

As another example, the plurality of light emitting devices 150 can be disposed irrespective of the division of the pixels to simultaneously emit light in all sub-pixels.

The light emitting device 150 of the embodiment can emit blue light, but is not limited thereto. For example, the light emitting device 150 of the embodiment can emit white light or purple light.

Meanwhile, the light emitting device 150 can emit red light, green light, and blue light for each sub-pixel. For this purpose, for example, a red light emitting device emitting red light can be disposed in the first sub-pixel, for example, the red sub-pixel. Also, a green light emitting device emitting green light can be disposed in the second sub-pixel, for example, the green sub-pixel. Also, a blue light emitting device emitting blue light can be disposed in the third sub-pixel, for example, the blue sub-pixel.

For example, each of the red light emitting device, the green light emitting device, and the blue light emitting device can include a group II-IV compound or a group III-V compound, but is not limited thereto. For example, group III-V compounds can be selected from the group consisting of a diatomic compound selected from the group consisting of GaN, GaP, GaAs, GaSb, AlN, AlP, AlAs, AlSb, InN, InP, InAs, InSb and mixtures thereof, ternary compounds selected from the group consisting of GaNP, GaNAs, GaNSb, GaPAs, GaPSb, AlInP, AlNP, AlNAs, AlNSb, AlPAs, AlPSb, InNP, InNAs, InNSb, InPAs, InPSb, GaAlNP and mixtures thereof, and quaternary compounds selected from the group consisting of AlGaInP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and mixtures thereof.

The color generating unit 42 can generate a color light different from the light provided by the light emitting unit 41.

For example, the color generator 42 can include a first color generator 43, a second color generator 44, and a third color generator 45. The first color generator 43 can correspond to the first sub-pixel PX1 of the pixel, the second color generator 44 can correspond to the second sub-pixel PX2 of the pixel, and the third color generator 45 can correspond to the third sub-pixel PX3 of the pixel.

The first color generating unit 43 can generate a first color light based on the light provided from the light emitting unit 41, the second color generating unit 44 can generate a second color light based on the light provided from the light emitting unit 41, and the third color generating unit 45 can generate third color light based on the light provided from the light emitting unit 41.

For example, the first color generating unit 43 outputs the blue light of the light emitting unit 41 as red light, the second color generating unit 44 outputs the blue light of the light emitting unit 41 as green light, and the third color generating unit 45 can output the blue light from the light emitting unit 41 as it is.

As an example, the first color generator 43 can include a first color filter, the second color generator 44 can include a second color filter, and the third color generator 45 can include a third color filter.

The first color filter, the second color filter, and the third color filter can be formed of a transparent material that allows light to pass therethrough.

For example, at least one of the first color filter, the second color filter, and the third color filter can include quantum dots.

The quantum dots of the embodiment can be selected from a group II-IV compound, a group III-V compound, a group IV-VI compound, a group IV element, a group IV compound, and combinations thereof.

Group II-VI compounds can be selected from the group consisting of a binary compound selected from the group consisting of CdSe, CdTe, ZnS, ZnSe, ZnTe, ZnO, HgS, HgSe, HgTe, MgSe, MgS, and mixtures thereof, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof, and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe and mixtures thereof.

Group III-V compounds can be selected from the group consisting of a binary compound selected from the group consisting of GaN, GaP, GaAs, GaSb, AlN, AlP, AlAs, AlSb, InN, InP, InAs, InSb, and mixtures thereof, a ternary compound selected from the group consisting of GaNP, GaNAs, GaNSb, GaPAs, GaPSb, AlInP, AlNP, AlNAs, AlNSb, AlPAs, AlPSb, InNP, InNAs, InNSb, InPAs, InPSb, GaAlNP, and mixtures thereof, and a quaternary compound selected from the group consisting of AlGaInP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof.

Group IV-VI compounds can be selected from the group consisting of a binary compound selected from the group consisting of SnS, SnSe, SnTe, PbS, PbSe, PbTe, and mixtures thereof, a ternary compound selected from the group consisting of SnSeS, SnSeTe, SnSTe, PbSeS, PbSeTe, PbSTe, SnPbS, SnPbSe, SnPbTe, and mixtures thereof, and a quaternary compound selected from the group consisting of SnPbSSe, SnPbSeTe, SnPbSTe, and mixtures thereof.

The group IV element can be selected from the group consisting of Si, Ge, and mixtures thereof. The group IV compound can be a binary compound selected from the group consisting of SiC, SiGe, and mixtures thereof.

Such quantum dots can have a full width of half maximum (FWHM) of an emission wave spectrum of about 45 nm or less, and light emitted through the quantum dots can be emitted in all directions. Accordingly, the viewing angle of the light emitting display device can be improved.

On the other hand, quantum dots can have the form of spherical, pyramidal, multi-arm, or cubic nanoparticles, nanotubes, nanowires, nanofibers, nanoplatelet particles, etc. However, the present invention is not limited thereto.

For example, when the light emitting device 150 emits blue light, the first color filter can include red quantum dots, and the second color filter can include green quantum dots. The third color filter may not include quantum dots, but is not limited thereto. For example, blue light from the light emitting device 150 can be absorbed by the first color filter, and the absorbed blue light can be wave-shifted by red quantum dots to output red light. For example, blue light from the light emitting device 150 can be absorbed by the second color filter, and the absorbed blue light can be wave-shifted by green quantum dots to output green light. For example, blue light from the light emitting device can be absorbed by the third color filter, and the absorbed blue light can be emitted as it is.

Meanwhile, when the light emitting device 150 is white light, not only the first color filter and the second color filter, but also the third color filter can include quantum dots. For example, the wave of white light from the light emitting device 150 can be shifted to blue light by the quantum dots included in the third color filter.

For example, at least one of the first color filter, the second color filter, and the third color filter can include a phosphor. For example, some color filters among the first color filter, the second color filter, and the third color filter can include quantum dots, and others can include a phosphor. For example, each of the first color filter and the second color filter can include a phosphor and quantum dots.

For example, at least one of the first color filter, the second color filter, and the third color filter can include scattering particles. Since blue light incident to each of the first color filter, the second color filter, and the third color filter is scattered by the scattering particles and the scattered blue light is color-shifted by the corresponding quantum dots, light output efficiency can be improved.

As another example, the first color generator 43 can include a first color conversion layer and a first color filter. The second color generator 44 can include a second color conversion and a second color filter. The third color generator 45 can include a third color conversion layer and a third color filter. Each of the first color conversion layer, the second color conversion layer, and the third color conversion layer can be disposed adjacent to the light emitting unit 41. The first color filter, the second color filter, and the third color filter can be disposed adjacent to the second substrate 46.

For example, the first color filter can be disposed between the first color conversion layer and the second substrate 46. For example, the second color filter can be disposed between the second color conversion layer and the second substrate 46. For example, the third color filter can be disposed between the third color conversion layer and the second substrate 46.

For example, the first color filter can be in contact with the upper surface of the first color conversion layer and can have the same size as the first color conversion layer, but the present invention is not limited thereto. For example, the second color filter can be in contact with the upper surface of the second color conversion layer and can have the same size as the second color conversion layer, but is not limited thereto. For example, the third color filter can be in contact with the upper surface of the third color conversion layer and can have the same size as the third color conversion layer, but is not limited thereto.

For example, the first color conversion layer can include red quantum dots, and the second color conversion layer can include green quantum dots. The third color conversion layer may not include quantum dots. For example, the first color filter can include a red-based material that selectively transmits the red light converted by the first color conversion layer, the second color filter can include a green-based material that selectively transmits the green light converted in the second color conversion layer, the third color filter can include a blue-based material that selectively transmits the blue light transmitted as it is from the third color conversion layer.

Meanwhile, when the light emitting device 150 is white light, not only the first color conversion layer and the second color conversion layer, but also the third color conversion layer can include quantum dots. For example, the wave of white light from the light emitting device 150 can be shifted to blue light by the quantum dots included in the third color filter.

Referring back to FIG. 13, the second substrate 46 can be disposed on the color generator 42 to protect the color generator 42. The second substrate 46 can be formed of glass, but is not limited thereto.

The second substrate 46 can be referred to as a cover window, a cover glass, or the like.

The second substrate 46 can be formed of glass or a flexible material, but is not limited thereto.

Meanwhile, in the embodiment, even if a wave deviation is generated between a plurality of semiconductor light emitting devices formed on the wafer by bending of the wafer when the plurality of semiconductor layers are grown, the wave deviation can be minimized by a post-process. As such, a display device using a semiconductor light emitting device having a minimized wave deviation is manufactured, so that the mura phenomenon can be prevented.

Here, the post-process can refer to a process of adjusting the light emitting regions 341 and 342 (refer to FIG. 18) of the semiconductor light emitting device.

As a first embodiment, adjusting the light emitting area of the semiconductor light emitting device can mean adjusting the area of the transparent conductive layer 3140 (FIGS. 19 to 21).

As a second embodiment, adjusting the light emitting area of the semiconductor light emitting device can mean adjusting the area of the active layer 3120 (in FIGS. 22 to 24).

As a third embodiment, adjusting the light emitting area of the semiconductor light emitting device can mean adjusting the area of the contact electrode 3240 (in FIGS. 25 to 27).

As a fourth embodiment, adjusting the light emitting region of the semiconductor light emitting device can mean adjusting the area of the current blocking layer 3260 (in FIGS. 28 to 30).

Various modifications can be made within the scope of the technical spirit of the present invention.

FIG. 14 is a plan view illustrating a display device according to an embodiment.

Referring to FIG. 14, the display device 300 according to the embodiment can include a substrate 301, a plurality of first semiconductor light emitting devices 310, a plurality of second semiconductor light emitting devices 320, and a plurality of third semiconductor light emitting devices 330. Many more components can be included.

The plurality of first semiconductor light emitting devices 310, the plurality of second semiconductor light emitting devices 320, and the plurality of third semiconductor light emitting devices 330 can be assembled on the substrate 301 by a self-assembly method (refer to FIGS. 9 and 10) or transferred onto the substrate 301 by a transfer method (refer to FIGS. 11 and 12.)

The substrate 301 can include a plurality of first sub-pixels PX1, a plurality of second sub-pixels PX2, and a plurality of third sub-pixels PX3. The second sub-pixel can be in contact with the first sub-pixel, and the third sub-pixel can be in contact with the second sub-pixel, but embodiments are not limited thereto.

As shown in FIG. 5, a plurality of first sub-pixels PX1, a plurality of second sub-pixels PX2, and a plurality of third sub-pixels PX3 can be defined by the intersection of the scan lines S1-Sn and the data lines D1-Dm.

As shown in FIG. 6, transistors ST and DT and capacitors Cst can be formed in the plurality of first sub-pixels PX1, the plurality of second sub-pixels PX2, and the plurality of third sub-pixels PX3.

As shown in FIGS. 9 and 10, in the case of the self-assembly method, an assembly hole 203 can be disposed in each of the plurality of first sub-pixels PX1, the plurality of second sub-pixels PX2, and the plurality of third sub-pixels PX3.

In the FIG, the plurality of first sub-pixels PX1, the plurality of second sub-pixels PX2, and the plurality of third sub-pixels PX3 have a rectangular shape, but can have a square shape or other shapes.

A first semiconductor light emitting device 310 can be disposed in each of the plurality of first sub-pixels. The first semiconductor light emitting device 310 can generate a first color light having a first main wave. A second semiconductor light emitting device 320 can be disposed in each of the plurality of second sub-pixels. The second semiconductor light emitting device 320 can generate a second color light having a second main wave. A third semiconductor light emitting device 330 can be disposed in each of the plurality of third sub-pixels. The third semiconductor light emitting device 330 can generate a third color light having a third main wave.

For example, the first semiconductor light emitting device 310 can generate red light, the second semiconductor light emitting device 320 can generate green light, and the third semiconductor light emitting device 330 can generate blue light. However, the present invention is not limited thereto.

The first to third semiconductor light emitting devices 310, 320, and 330 can include at least three semiconductor layers made of a compound semiconductor material. For example, the compound semiconductor material can be a group III-V compound semiconductor material, a group II-VI compound material, or the like. For example, the compound semiconductor material can include GaN, InGaN, AlN, AlInN, AlGaN, AlInGaN, InP, GaAs, GaP, GaInP, or the like.

For example, each of the first to third semiconductor light emitting devices 310, 320, and 330 can have the same or similar structure. For example, each of the first to third semiconductor light emitting devices 310, 320, and 330 can be disposed on a first conductivity type semiconductor layer 3110 and 3210 of FIGS. 19 to 30 including a first conductivity type dopant, an active layer 3210, 3220 on the first conductivity type semiconductor layer 3110, 3210, and a second conductivity type semiconductor layer 3130, 3230 on the active layer 3210, 3220. For example, the first conductivity type dopant can be an n-type dopant such as silicon (Si), and the second conductivity type dopant can be a p-type dopant such as boron (B).

Each of the first to third semiconductor light emitting devices 310, 320, 330 can be selected from a plurality of compound semiconductor materials according to the main wave of light to be generated, a first conductivity type semiconductor layer (3110 of FIGS. 19 to 24, 3210 of FIGS. 25 to 30), active layers 3120, 3220, and second conductivity type semiconductor layers 3130, 3230. For example, in the first semiconductor light emitting device 310 generating red light, a first conductivity type semiconductor layer 3110, 3210, active layer 3210, 3220 and a second conductivity type semiconductor layer 3130, 3230 can be formed using a compound semiconductor material selected from InP, GaAs, GaP, GaInP, or the like.

For example, in the second semiconductor light emitting device 320 generating green light or the third semiconductor light emitting device generating blue light, first conductivity type semiconductor layers 3110, 3210, active layers 3210, 3220, and second conductivity type semiconductor layers 3130, 3230 can be formed using a compound semiconductor material selected from GaN or the like.

The substrate 301 can include a plurality of fourth sub-pixels. The fourth sub-pixel can be in contact with at least one of the first sub-pixel PX1, the second sub-pixel PX2, and the third sub-pixel PX3. For example, the semiconductor light emitting device may not be disposed in the fourth sub-pixel and can be empty. Accordingly, the fourth sub-pixel may not emit any light. For example, a fourth semiconductor light emitting device can be disposed in the fourth sub-pixel. The fourth semiconductor light emitting device can generate a fourth color light having a fourth main wave. For example, the fourth semiconductor light emitting device can generate white light.

Since the structures of the first semiconductor light emitting device 310, the second semiconductor light emitting device 320, and the third semiconductor light emitting device 330 can be the same, hereinafter, the structure of the first semiconductor light emitting device 310 will be mainly described.

As shown in FIG. 15, each of the plurality of first semiconductor light emitting devices 310 is manufactured from different positions or regions of the wafer 380, and can be disposed in a sub-pixel corresponding to a random position among the plurality of first sub-pixels PX1 of the substrate 301.

As shown in FIGS. 14 and 15, the plurality of first semiconductor light emitting devices 310 can include a first-first semiconductor light emitting device 310_1, a first-second semiconductor light emitting device 310_2, and a first-third semiconductor light emitting device 310_3.

For example, the first-first semiconductor light emitting device 310_1 can be manufactured in the first region 1001 of the wafer 380, the first-second semiconductor light emitting device 310_2 can be manufactured in the second region 1002 of the wafer 380, and the first-third semiconductor light emitting devices 310_3 can be manufactured in the third region of the wafer 380. For example, the third region 1003 can be a central region of the wafer 380. For example, the first region 1001 can have a greater diameter than that of the third region 1003 and surround the third region 1003. For example, the second region 1002 can have a greater diameter than that of the first region 1001 and surround the first region 1001.

The semiconductor light emitting device 310_1 can be disposed in the first sub-pixel PX1 positioned in the central region of the wafer 380, for example, in the first region 1001 adjacent to the third region 1003, and positioned in the left region of the substrate 301. The first-second semiconductor light emitting device 310_2 (in FIG. 16) is located in a second region 1002 further away from the third region 1003 than the first region 1001 of the wafer 380, therefore, can be disposed in the first sub-pixel PX1 positioned in the third area 1003 of the substrate 301.

On the other hand, as shown in FIG. 15, since the semiconductor layers respectively deposited on the wafer 380 are deposited while the wafer 380 rotates with the process during the semiconductor deposition process, the regions 1001, 1002, and 1003 of the wafer 380 can have a concentric shape. Here, the first-first semiconductor light emitting device 310_1, the first-second semiconductor light emitting device 310_2, and the first-third semiconductor light emitting device 310_3 can have different wave deviations from each other.

The first main wave of the first color light of each of the first-first semiconductor light emitting devices 310_1 manufactured in the first region 1001 of the wafer 380 can be the same or substantially similar. The first main wave of the first color light of each of the first-second semiconductor light emitting devices 310_2 manufactured in the second region 1002 of the wafer 380 can be the same or substantially similar. The first main wave of the first color light of each of the first to third semiconductor light emitting devices 310_3 manufactured in the third region of the wafer 380 can be the same or substantially similar.

Alternatively, each of the first-first semiconductor light emitting device 310_1 manufactured in the first region 1001 of the wafer 380, the first-second semiconductor light emitting device 310_2 manufactured in the second region 1002 of the wafer 380, and the first-third semiconductor light emitting device 310_3 manufactured in the third region of the wafer 380 can have a different first main wave of the first color light.

For example, the first main wave of the first color light of the first-first semiconductor light emitting device 310_1 manufactured in the first region 1001 of the wafer 380 can be the same as the first main wave (hereinafter, referred to as a preset first main wave) of the first color light of the first color required by the display device 300. In order to display an image on the display device 300, an optimal main wave of each color light can be required.

For example, the first main wave of the first color light of the first-second semiconductor light emitting device 33 (of FIG. 16) manufactured in the second region 1002 of the wafer 380 can be less than the first main wave of the first color light of the first-first semiconductor light emitting device 310_1 manufactured in the first region 1001 of the wafer 380. For example, the first main wave of the first color light of the first-third semiconductor light emitting devices 31 (of FIG. 16) manufactured in the third region of the wafer 380 can be greater than the first main wave of the first color light of the first-first semiconductor light emitting device 310_1 manufactured in the first region 1001 of the wafer 380.

This is due to warpage due to different stresses caused by the temperature conditions for forming each semiconductor layer and the material properties for forming each semiconductor layer during the semiconductor deposition process. For example, when each semiconductor layer of the first semiconductor light emitting device 310 is grown through a semiconductor deposition process, a warpage can occur in the wafer 380 due to high temperature and heat.

For example, different stresses are applied between each semiconductor layer due to the high temperature and heat, and material properties of the semiconductor material used to form each semiconductor layer, and the wafer 380 is bent in a specific direction due to the stress difference (refer to FIGS. 1A and 1).

In the first semiconductor light emitting device 310 manufactured on the wafer 380 in which the warpage has occurred, a wave deviation ΔWD can be generated for each position.

Conventionally, as shown in FIG. 14, when the first-first semiconductor light emitting device 310_1, the first-second semiconductor light emitting device 33 (in FIG. 16), and the first-third semiconductor light emitting device 31 (in FIG. 16) having different wave deviations ΔWD can be disposed on the substrate 301, there can be a problem in that a mura phenomenon occurs as shown in FIG. 3.

In the embodiment, by removing or minimizing the wave deviation (ΔWD) of the first color light of the plurality of first semiconductor light emitting devices 310 manufactured for each position of the wafer 380 even if warpage occurs in the wafer 380 by the semiconductor deposition process, it is possible to prevent the mura phenomenon occurring when the display device 300 is driven using the first semiconductor light emitting device 310.

To this end, as shown in FIG. 18, each of the plurality of first semiconductor light emitting devices 310 can have different light emitting regions 341 and 342 to compensate for the wave deviation ΔWD of the first main wave.

For example, as shown in FIGS. 15 and 16, the first-second semiconductor light emitting device 33 positioned in the second region 1002 of the wafer 380 and having a wave less than the preset first main wave can be compensated with the preset first main wave, a first-second semiconductor light emitting device 310_2 compensated with the first main wave can be obtained.

In addition, the first-third semiconductor light emitting devices 310_3 positioned in the third region 1003 of the wafer 380 and having a wave greater than the preset first main wave can be compensated with the preset main wave, the first-third semiconductor light emitting devices 310_3 compensated for the first main wave can be obtained.

Meanwhile, since the first-first semiconductor light emitting device 310_1 positioned in the first region 1001 of the wafer 380 has the same main wave as the preset first main wave, a separate correction for the main wave can be not required.

In this way, the first semiconductor light emitting devices 310, 310_1, 310_2, 310_3 that are located in different regions 1001, 1002, and 1003 of the wafer 380 and compensated for waves smaller than or larger than the preset wave with the preset main wave can be obtained. As the first semiconductor light emitting devices 310, 310_1, 310_2, and 310_3 compensated in this way are mounted on the display device 300, even when the corresponding display device 300 is driven, the mura phenomenon can be prevented by minimizing or not having a wave deviation between the first semiconductor light emitting devices 310, 310_1, 310_2, and 310_3 disposed in each pixel.

Meanwhile, the above-described compensation can be performed by adjusting the light emitting regions 341 and 342 of the first semiconductor light emitting device 310 as shown in FIG. 18. For example, the area of the light emitting regions 341 and 342 of the first semiconductor light emitting device 310 can be adjusted within a range of 10% to 99% of the size of the first semiconductor light emitting device 310.

For example, when the area of the light emitting regions 341 and 342 is less than 10%, the amount of light emitted from the light emitting region of the first semiconductor light emitting device 310 is very small, so that luminance can be reduced. If the area of the light emitting regions 341 and 342 exceeds 99%, a short circuit can occur because the area of the light emitting regions 341 and 342 can be formed on the side surface of the light emitting layer 3100 due to the process margin 3140 being beyond the maximum range.

After the plurality of semiconductor layers are formed by the semiconductor deposition process, the plurality of semiconductor layers are etched through mesa etching to separate the light emitting layer 3100 in units of chips.

In this case, the light emitting regions 341 and 342 can be adjusted through mesa etching. Here, the light emitting regions 341 and 342 can mean the area of the active layer (3120 in FIGS. 22a to 24b).

For example, post-process after mesa etching, for example, the area of the transparent conductive layer 3140 (in FIGS. 19a to 21b), the area of the contact electrode 3240 (refer to FIGS. 25 to 27), the area of the current blocking layer 3260 (in FIGS. 28 to 30), etc. can be adjusted as the light emitting regions 341 and 342.

As shown in Equation 1, the areas of the light emitting regions 341 and 342 can be related to the current density (J).

$$J=I/A \qquad \text{<Equation formula 1>}$$

"I" can represent a current supplied to the first semiconductor light emitting device 310, and "A" can represent the areas of the light emitting regions 341 and 342.

As shown in Equation 1, when the driving current is constant, the area and current density of the light emitting regions 341 and 342 can have an inverse relationship. For example, as shown in FIG. 17, as the area of the light emitting regions 341 and 342 increases, the current density decreases, and as the area of the light emitting regions 341 and 342 decreases, the current density increases.

Therefore, as shown in FIGS. 15, 16 and 17, the first-second semiconductor light-emitting device 33 located in the second region 1002 of the wafer 380 has a first-second light emitting area larger than a first-first light emitting area of the first-first semiconductor light emitting device 310_1 positioned in the first region 1001 of the wafer 380, the current density can be reduced. As the current density decreases, the first main wave of the first color light of the first-second semiconductor light emitting device 33 can be shifted toward the first main wave.

For example, the light emitting area of the first-second semiconductor light emitting device 33 is enlarged, so that the first-second semiconductor light-emitting device 310_2 compensated for by the first main wave of the first color light of the first-first semiconductor light-emitting device 310_1 positioned in the first region 1001 of the wafer can be obtained. For example, the first-first light emitting region can have an area corresponding to 50% of the size of the first-first semiconductor light emitting device 310_1, but is not limited thereto. In this case, the first-second emitting region can be 50% to 90% of the size of the first-second semiconductor light emitting device 310_2.

The first-third semiconductor light emitting device 31 positioned in the third region 1004 of the wafer 380 can have a first-third light emitting region smaller than a first-first light emitting region of the first-first light emitting device 310_1 positioned in the first region 1001 of the wafer 380 to increase the current density.

As the current density increases, the first main wave of the first color light of the first-third semiconductor light emitting devices 31 can be shifted toward a preset first main wave. For example, the light emitting area of the first-third semiconductor light emitting device 31 is reduced, the first-third semiconductor light emitting device 310_3 compensated for the first main wave of the first color light of the first semiconductor light emitting device positioned in the first region 1001 of the wafer 380 can be obtained. For example, the first-second emitting region can be 10% to 50% of the size of the first-second semiconductor light emitting device 310_2.

A wave deviation ΔWD from a preset first main wave and the emission regions 341 and 342 of the first semiconductor light emitting device 310 can have an inverse relationship with each other. For example, as the first main wave of the first color light of the first semiconductor light emitting device 310 becomes larger than the preset main wave, the area of the light emitting region 341 of the first semiconductor light emitting device 310 becomes smaller and smaller.

For example, as the first main wave of the first color light of the first semiconductor light emitting device 310 becomes smaller than the preset main wave, the area of the light emitting region 342 of the first semiconductor light emitting device 310 can gradually increase.

Hereinafter, various modifications of the light emitting regions 341 and 342 of the first semiconductor light emitting device 310 will be described. Even if it is omitted from the description below, if it can be changed in the following modifications, it is clear that it is within the scope of the technical spirit of the present invention.

A First Embodiment

According to the first embodiment, the wave deviation ΔWD of the first main wave can be compensated by adjusting the area of the transparent conductive layer 3140 as the light emitting regions 341 and 342.

FIG. 19A is a plan view illustrating a first-first semiconductor light emitting device according to the first embodiment. And FIG. 19B is a cross-sectional view illustrating a first-first semiconductor light emitting device according to the first embodiment.

As shown in FIGS. 19A and 19B, the first-first semiconductor light emitting device 310_1 according to the first embodiment can include a light emitting layer 3100, a transparent conductive layer 3140, an insulating layer 3150, a first electrode 3160, and a second electrode 3170. Many more components can be included.

The emission layer 3100 can include a first-first conductivity type semiconductor layer 3110, an active layer 3120, and a first-second conductivity type semiconductor layer 3130. Since the first-first conductivity type semiconductor layer 3110, the active layer 3120, and the first-second conductivity type semiconductor layer 3130 have already been described above, a detailed description thereof will be omitted. Each of the first-first conductivity type semiconductor layer 3110 and the first-second conductivity type semiconductor layer 3130 can include at least one semiconductor layer.

The transparent conductive layer 3140 can be formed of a conductive material so that the driving current is supplied to the entire region of the active layer 3120 by being disposed on the first-second conductivity type semiconductor layer 3130 and spreading the current in the horizontal direction.

The insulating layer 3150 can surround the light emitting layer 3100, thereby protecting the light emitting layer 3100 from the outside and preventing leakage current from leaking along the outer side surface of the light emitting layer 3100. For example, the insulating layer 3150 can be formed of an inorganic material such as silicon oxide-based (SiOx) or silicon nitride-based (SiNx), but is not limited thereto.

Each of the first electrode 3160 and the second electrode 3170 is an electrode member that is electrically connected to the outside to smoothly supply current to the light emitting layer 3100, and can be made of a metal having excellent electrical conductivity. For example, each of the first electrode 3160 and the second electrode 3170 can include at least one metal layer.

The semiconductor light emitting device 3101 can be a semiconductor light emitting device positioned in the first region 1001 of the wafer 380 shown in FIG. 15. The first main wave of the first color light of the first-first semiconductor light emitting device 310_1 positioned in the first region 1001 of the wafer 380 can be the same as a preset first main wave. Accordingly, the area of the transparent conductive layer 3140, which is the first-first emitting region of the first-first semiconductor light emitting device 310_1, can be designed to generate a current density corresponding to the first color light having a preset first main wave.

Meanwhile, the area of the transparent conductive layer of each of the semiconductor light emitting devices located in the second region or the third region of the wafer, for example, the area of the transparent conductive layer 3140 of each of the first-second semiconductor light emitting device 310_2 (in FIGS. 20A and 20B) or the first-third semiconductor light emitting device 310_3 (in FIGS. 21A and 21B) can be designed to be larger or smaller based on the area of the transparent conductive layer 3140 of the first-first semiconductor light emitting device (310_1 in FIGS. 19A and 19B).

FIG. 20A is a plan view illustrating a first-second semiconductor light emitting device according to the first embodiment. And FIG. 20B is a cross-sectional view illustrating a first-second semiconductor light emitting device according to the first embodiment.

Since the structure, shape, and/or function of the first-second semiconductor light emitting device 310_2 according to the first embodiment can be the same as that of the first-first semiconductor light emitting device 310_1, a detailed description of the structure will be omitted.

As shown in FIGS. 20A and 20B, the first-second semiconductor light emitting device 310_2 is a semiconductor light emitting device positioned in the second region 1002 of the wafer 380 and generates a first color light having a wave smaller than a preset first main wave. Accordingly, in order to eliminate or minimize the wave deviation ΔWD of the first main wave, an area of the transparent conductive layer 3140 of the first-second semiconductor light emitting device 310_2 can be larger than an area of the transparent conductive layer 3140 of the first-first semiconductor light emitting device 310_1.

By the area of the transparent conductive layer 3140 of the first-second semiconductor light emitting device 3102 is larger than the area of the transparent conductive layer 3140 of the first-first semiconductor light emitting device 310_1, as shown in FIG. 17, as the current density of the transparent conductive layer 3140 of the first-second semiconductor light emitting device 310_2 decreases, as shown in FIG. 16, the first-second semiconductor light emitting device 310_2 shifted to increase toward a preset first main wave can be obtained.

Accordingly, the first main wave of the first color light compensated for in the first-second semiconductor light emitting device 310_2 can be the same as or close to the first main wave of the first color generated in the first-first semiconductor device.

FIG. 21A is a plan view illustrating a semiconductor light emitting device first-third according to the first embodiment. FIG. 21B is a cross-sectional view illustrating a first-third semiconductor light emitting device according to the first embodiment.

Since the structure, shape, and/or function of the first-third semiconductor light emitting device 310_3 is the same as that of the first-first semiconductor light emitting device 310_1 according to the first embodiment, a detailed description of the structure will be omitted.

As shown in FIGS. 21A and 21B, the first-third semiconductor light emitting devices 310_3 are semiconductor light emitting devices positioned in the third region 1003 of the wafer 380 and generate first color light having a wave greater than a preset first main wave. Accordingly, in order to remove or minimize the wave deviation ΔWD of the first main wave, the area of the transparent conductive layer 3140 of the first-third semiconductor light emitting device 310_3 can be smaller than the area of the transparent conductive layer 3140 of the first-first semiconductor light emitting device 310_1.

As the area of the transparent conductive layer 3140 of the first-third semiconductor light emitting device 310_3 is smaller than the area of the transparent conductive layer 3140 of the first-first semiconductor light emitting device 310_1, as shown in FIG. 17, the shift first-third semiconductor light emitting device 310_3 can be obtained such that the current density of the transparent conductive layer 3140 of the first-third semiconductor light emitting device 310_3 increases and decreases toward a preset first main wave as shown in FIG. 16.

Accordingly, the first main wave of the first color light compensated by the first-third semiconductor light emitting device 310_3 can be the same as or close to the first main wave of the first color generated in the first-first semiconductor device.

From the above, by both the first-second semiconductor light emitting device 310_2 and the first-third semiconductor light emitting device 310_3 are compensated with the first main wave of the first color light generated by the first-first semiconductor light emitting device 310_1, the wave deviation ΔWD between the first-first semiconductor light emitting device 310_1, the first-second semiconductor light emitting device 310_2, and the first-third semiconductor light emitting device 310_3 can be removed or minimized.

Accordingly, when the display device 300 in which the first-first semiconductor light emitting device 310_1, the first-second semiconductor light emitting device 310_2, and the first-third semiconductor light emitting device 310_3 are disposed is driven, the mura phenomenon due to the wave deviation ΔWD between the first-first semiconductor light emitting device 310_1, the first-second semiconductor light emitting device 310_2, and the first-third semiconductor light emitting device 310_3 does not occur.

Second Embodiment

According to the second embodiment, the wave deviation ΔWD of the first main wave can be compensated by adjusting the area of the active layer 3120 as the light emitting regions 341 and 342.

FIG. 22A is a plan view illustrating a first-first semiconductor light emitting device according to a second embodiment. And FIG. 22B is a cross-sectional view illustrating a first-first semiconductor light emitting device according to the second embodiment.

The first-first semiconductor light emitting device 310_1 according to the embodiment can include light emitting layers 3100 (3110, 3120, 3130), a transparent conductive layer 3140, an insulating layer 3150, a first electrode 3160, and a second electrode 3170. Many more components can be included.

As shown in FIGS. 22A and 22B, the light emitting layer 3100 can include a first-first conductivity type semiconductor layer 3110, an active layer 3120, and a first-second conductivity type semiconductor layer 3130.

Components not described below can be easily understood from the description of the first embodiment.

The semiconductor light emitting device 3101 can be a semiconductor light emitting device positioned in the first region 1001 of the wafer 380 shown in FIG. 15. The first main wave of the first color light of the semiconductor light emitting device positioned in the first region 1001 of the wafer 380 can be the same as a preset first main wave.

Accordingly, the area of the active layer 3120, which is the first-first emitting region of the first-first semiconductor light emitting device 310_1, can be designed to generate a current density corresponding to the first color light having a preset first main wave.

Meanwhile, the area of the active layer of each of the semiconductor light emitting devices located in the second region or the third region of the wafer, for example, the area of the active layer 3120 of each of the first-second semiconductor light emitting device 310_2 (in FIGS. 23A and 23B) or the first-third semiconductor light emitting device 3103 (in FIGS. 24A and 24B) can be designed to be larger or smaller based on the area of the active layer 3120 of the first-first semiconductor light emitting device 310_1 (in FIGS. 22A and 22B).

FIG. 23A is a plan view illustrating a first-second semiconductor light emitting device according to a second embodiment. And FIG. 23B is a cross-sectional view illustrating a first-second semiconductor light emitting device according to the second embodiment.

Since the structure, shape, and/or function of the first-first semiconductor light emitting device 310_1 can be the same as that of the first-second semiconductor light emitting device 310_2 according to the embodiment, a detailed description of the structure is omitted.

As shown in FIGS. 23A and 23B, the first-second semiconductor light emitting device 310_2 is a semiconductor light emitting device positioned in the second region 1002 of the wafer 380 and generates a first color light having a wave smaller than a preset first main wave. Accordingly, in order to eliminate or minimize the wave deviation ΔWD of the first main wave, an area of the active layer 3120 of the first-second semiconductor light emitting device 310_2 can be larger than an area of the active layer 3120 of the first-first semiconductor light emitting device 310_1.

By the area of the active layer 3120 of the first-second semiconductor light emitting device 310_2 is larger than the area of the active layer 3120 of the first-first semiconductor light emitting device 310_1, as shown in FIG. 17, so the current density of the active layer 3120 of the first-second semiconductor light emitting device 310_2 decreases, as shown in FIG. 16 such that the first-second semiconductor light emitting device 310_2 shifted to increase toward a preset first main wave can be obtained.

Accordingly, the first main wave of the first color light compensated for in the first-second semiconductor light emitting device 310_2 can be the same as or close to the first main wave of the first color generated in the first-first semiconductor device.

Meanwhile, the area of the transparent conductive layer 3140 can be changed at the same or similar rate to the area of the active layer 3120. Since the area of the active layer 3120 of the first-second semiconductor light emitting device 3102 is designed to be larger than the area of the active layer 3120 of the first-first semiconductor light emitting device 310_1, the area of the transparent conductive layer 3140 can be designed to increase in proportion to an increase ratio of the area of the active layer 3120 of the first-second semiconductor light emitting device 310_2.

FIG. 24A is a plan view illustrating a semiconductor light emitting device first-third according to a second embodiment. And FIG. 24B is a cross-sectional view illustrating a first-third semiconductor light emitting device according to the second embodiment.

Since the structure, shape, and/or function of the first-third semiconductor light emitting device 3103 is the same as that of the first-first semiconductor light emitting device 310_1 according to the embodiment, a detailed description of the structure will be omitted.

As shown in FIGS. 24A and 24B, the first-third semiconductor light emitting device 310_3 is a semiconductor light emitting device positioned in the third region 1003 of the wafer 380 and generates a first color light having a wave greater than a preset first main wave. Accordingly, in order to eliminate or minimize the wave deviation ΔWD of the first main wave, an area of the active layer 3120 of the first-third semiconductor light emitting device 310_3 can be smaller than an area of the active layer 3120 of the first-first semiconductor light emitting device 310_1.

By the area of the active layer 3120 of the first-third semiconductor light emitting device 310_3 is smaller than the area of the active layer 3120 of the first-first semiconductor light emitting device 310_1, as shown in FIG. 17, so the current density of the active layer 3120 of the first-third semiconductor light emitting device 310_3 increases, as shown in FIG. 16 such that the first-third semiconductor light emitting device 310_3 shifted to decrease toward a preset first main wave can be obtained.

Accordingly, the first main wave of the first color light compensated by the first-third semiconductor light emitting device 310_3 can be the same as or close to the first main wave of the first color generated in the first-first semiconductor device.

Meanwhile, the area of the transparent conductive layer 3140 can be changed at the same or similar rate to the area of the active layer 3120. Since the area of the active layer 3120 of the first-third semiconductor light emitting device 310_3 is designed to be smaller than the area of the active layer 3120 of the first-first semiconductor light emitting device 310_1, the area of the active layer 3120 can be designed so that the area of the active layer 3120 of the first-third semiconductor light emitting device 310_3 becomes smaller in proportion to a smaller ratio of the area of the active layer 3120.

From the above, since both the first-second semiconductor light emitting device 310_2 and the first-third semiconductor light emitting device 310_3 are compensated with the first main wave of the first color light generated by the first-first semiconductor light emitting device 310_1, the wave deviation ΔWD between the first-first semiconductor light emitting device 310_1, the first-second semiconductor light emitting device 310_2, and the first-third semiconductor light emitting device 310_3 can be removed or minimized.

Accordingly, when the display device 300 using the first-first semiconductor light emitting device 310_1, the first-second semiconductor light emitting device 310_2, and the first-third semiconductor light emitting device 310_3 is driven, the mura phenomenon due to the wave deviation ΔWD between the first-first semiconductor light emitting device 310_1, the first-second semiconductor light emitting device 310_2, and the first-third semiconductor light emitting device 310_3 may not occur.

The first semiconductor light emitting devices 310_1, 310_2, and 310_3 according to the above first and second embodiments can be a horizontal semiconductor light emitting device in which the first electrode 3160 and the second electrode 3170 are disposed in the same direction or a flip chip semiconductor light emitting device.

Third Embodiment

In the embodiment, the wave deviation ΔWD of the first main wave can be compensated by adjusting the area of the contact electrode 3240 as the light emitting regions 341 and 342.

FIG. 25 is a cross-sectional view illustrating a first-first semiconductor light emitting device according to a third embodiment.

As shown in FIG. 25, the first-first semiconductor light emitting device 310_1 according to the third embodiment can include an emission layer 3200, an insulating layer 3250, and a contact electrode 3240. Many more components can be included.

Since the light emitting layer 3200 and the insulating layer 3250 have been described in detail above, a detailed description thereof will be omitted.

The emission layer 3200 can include a first-first conductivity type semiconductor layer 3210, an active layer 3220, and a first-second conductivity type semiconductor layer 3230. Each of the first-first conductivity type semiconductor layer 3210 and the first-second conductivity type semiconductor layer 3230 can include at least one semiconductor layer. A bonding electrode for connecting to a wiring electrode of the display substrate 301 can be disposed under the first-first conductive type semiconductor layer 3210 of the emission layer 3200.

Components not described below can be easily understood from the description of the first or second embodiments.

The insulating layer 3250 surrounding the emission layer 3200 can be etched such that a portion of the upper surface of the first-second conductivity type semiconductor layer 3230 of the emission layer 3200 is exposed. A contact electrode 3240 can be disposed in contact with the exposed first-second conductivity type semiconductor layer 3230. A portion of the contact electrode 3240 can be in contact with the top surface of the first-second conductivity type semiconductor layer 3230, and a portion of the contact electrode 3240 can be disposed to vertically overlap a portion of the insulating layer 3250.

The semiconductor light emitting device 310_1 can be a semiconductor light emitting device positioned in the first region 1001 of the wafer 380 of FIG. 15. Accordingly, the contact area of the contact electrode 3240 in contact with the first-second conductivity type semiconductor layer 3230, which is the first-first emission region of the first-first semiconductor light emitting device 310_1 can be designed to generate a current density corresponding to the first color light having a preset first main wave.

Accordingly, the semiconductor light emitting device positioned in the second region 1002 or the third region 1003 of the wafer 380, a contact area of the contact electrode 3240 in contact with the first-second conductivity type semiconductor layer 3230 of each of the first-second semiconductor light emitting devices 310_2 (in FIG. 26) and first-third semiconductor light emitting devices 3103 (in FIG. 27) can be designed to be larger or smaller based on the contact area of the contact electrode 3240 in contact with the first-second conductivity type semiconductor layer 3230 of the first-first semiconductor light emitting device 310_1 (of FIG. 25).

FIG. 26 is a cross-sectional view illustrating a first-second semiconductor light emitting device according to a third embodiment.

Since the structure, shape, and/or function of the first-second semiconductor light emitting device 3102 is the same as that of the first-first semiconductor light emitting device 310_1 according to the embodiment, a detailed description of the structure will be omitted.

As shown in FIG. 26, the first-second semiconductor light emitting device 310_2 is a semiconductor light emitting device positioned in the second region 1002 of the wafer 380 and generates a first color light having a wave smaller than a preset first main wave. Accordingly, in order to remove or minimize the wave deviation $\Delta WD$ of the first main wave, the contact area of the contact electrode 3240 in contact with the first-second conductivity type semiconductor layer 3230 of the first-second semiconductor light emitting device 310_2 can be larger than the contact area of the contact electrode 3240 in contact with the first-second conductivity type semiconductor layer 3230 of the first-first semiconductor light emitting device 310_1.

By the contact area of the contact electrode 3240 in contact with the first-second conductivity type semiconductor layer 3230 of the first-second semiconductor light emitting device 310_2 is larger than the contact area of the contact electrode 3240 in contact with the first-second conductivity type semiconductor layer 3230 of the first-first semiconductor light emitting device 310_1, as shown in FIG. 17, as the current density of the contact area of the contact electrode 3240 in contact with the first-second conductivity type semiconductor layer 3230 of the first-second semiconductor light emitting device 310_2 decreases, as shown in FIG. 16, the first-second semiconductor light emitting device 3102 shifted to increase toward a preset first main wave can be obtained.

Accordingly, the first main wave of the first color light compensated for in the first-second semiconductor light emitting device 310_2 can be the same as or close to the first main wave of the first color generated in the first-first semiconductor device.

FIG. 27 is a cross-sectional view illustrating a semiconductor light emitting device first-third according to a third embodiment.

Since the structure, shape, and/or function of the first-third semiconductor light emitting device 3103 is the same as that of the first-first semiconductor light emitting device 310_1 according to the embodiment, a detailed description of the structure will be omitted.

As shown in FIG. 27, the first-third semiconductor light emitting device 310_3 is a semiconductor light emitting device positioned in the third region 1003 of the wafer 380 and generates a first color light having a wave lager than a preset first main wave. Accordingly, in order to remove or minimize the wave deviation $\Delta WD$ of the first main wave, the contact area of the contact electrode 3240 in contact with the first-second conductivity type semiconductor layer 3230 of the first-third semiconductor light emitting device 3102 can be smaller than the contact area of the contact electrode 3240 in contact with the first-second conductivity type semiconductor layer 3230 of the first-first semiconductor light emitting device 310_1.

By the contact area of the contact electrode 3240 in contact with the first-second conductivity type semiconductor layer 3230 of the first-third semiconductor light emitting device 310_3 is smaller than the contact area of the contact electrode 3240 in contact with the first-second conductivity type semiconductor layer 3230 of the first-first semiconductor light emitting device 310_1, as shown in FIG. 17, as the current density of the contact area of the contact electrode 3240 in contact with the first-second conductivity type semiconductor layer 3230 of the first-third semiconductor light emitting device 310_3 increases, as shown in FIG. 16, the first-third semiconductor light emitting device 310_3 shifted to decrease toward a preset first main wave can be obtained.

Accordingly, the first main wave of the first color light compensated by the first-third semiconductor light emitting device 310_3 can be the same as or close to the first main wave of the first color generated in the first-first semiconductor device.

From the above, by both the first-second semiconductor light emitting device 310_2 and the first-third semiconductor light emitting device 310_3 are compensated with the first main wave of the first color light generated by the first-first semiconductor light emitting device 310_1, the wave deviation $\Delta WD$ between the first-first semiconductor light emitting device 310_1, the first-second semiconductor light emitting device 310_2, and the first-third semiconductor light emitting device 310_3 can be removed or minimized.

Accordingly, when the display device 300 using the first-first semiconductor light emitting device 310_1, the first-second semiconductor light emitting device 310_2, and the first-third semiconductor light emitting device 310_3 is driven, the mura phenomenon due to the wave deviation $\Delta WD$ between the first-first semiconductor light emitting device 310_1, the first-second semiconductor light emitting device 310_2, and the first-third semiconductor light emitting device 310_3 may not occur.

Fourth Embodiment

According to the fourth embodiment, the wave deviation $\Delta WD$ of the first main wave can be compensated by adjusting the area of the current blocking layer 3260 as the light emitting regions 341 and 342.

FIG. 28 is a cross-sectional view illustrating a first-first semiconductor light emitting device according to a fourth embodiment.

As shown in FIG. 28, the first-first semiconductor light emitting device 310_1 according to the fourth embodiment can include an emission layer 3200, an insulating layer 3250, a current blocking layer 3260, and a contact electrode 3240. Many more components can be included.

Since the light emitting layer 3200 and the insulating layer 3250 have been described in detail above, a detailed description thereof will be omitted.

The emission layer 3200 can include a first-first conductivity type semiconductor layer 3210, an active layer 3220, and a first-second conductivity type semiconductor layer 3230. Each of the first-first conductivity type semiconductor layer 3210 and the first-second conductivity type semiconductor layer 3230 can include at least one semiconductor layer. A bonding electrode for connecting to a wiring electrode of the display substrate 301 can be disposed under the first-first conductive type semiconductor layer 3210 of the emission layer 3200.

Components not described below can be easily understood from the description of the first, second or third embodiments.

The insulating layer 3250 surrounding the emission layer 3200 can be etched such that a portion of the upper surface of the first-second conductivity type semiconductor layer 3230 of the emission layer 3200 is exposed. A current blocking layer 3260 can be disposed on the exposed upper surface of the first-second conductivity type semiconductor layer 3230.

For example, the first-second conductivity type semiconductor layer 3230 can include a first region 3230a and a second region 3230b surrounding the first region 3230a. In this case, the current blocking layer 3260 can be disposed on the second region 3230b of the first-second conductivity type semiconductor layer 3230. For example, the upper surface of the second region 3230b of the first-second conductivity type semiconductor layer 3230 is etched to form recesses dented therein, and the current blocking layer 3260 can be disposed in the recesses.

The contact electrode 3240 can be disposed on the first region 3230a and the current blocking layer 3260 of the first-second conductivity type semiconductor layer 3230. A portion of the contact electrode 3240 can be disposed to vertically overlap a portion of the insulating layer 3250.

The light emitting regions 341 and 342 can be the first region 3230a of the first-second conductivity type semiconductor layer 3230. In this case, the area of the first region 3230a of the first-second conductivity type semiconductor layer 3230 can be adjusted by the area of the current blocking layer 3260. For example, the area of the current blocking layer 3260 and the area of the first region 3230a of the first-second conductivity type semiconductor layer 3230 can have an inverse relationship.

For example, as the area of the current blocking layer 3260 increases, the area of the first region 3230a of the first-second conductivity type semiconductor layer 3230 can decrease. Accordingly, the area of the light emitting regions 341 and 342, for example, the area of the first region 3230a of the first-second conductivity type semiconductor layer 3230 can be adjusted by adjusting the area of the current blocking layer 3260.

The semiconductor light emitting device 310_1 can be a semiconductor light emitting device positioned in the first region 1001 of the wafer 380 of FIG. 15. The first main wave of the first color light of the semiconductor light emitting device positioned in the first region 1001 of the wafer 380 can be the same as a preset first main wave.

Accordingly, the area of the first region 3230a of the first-second conductivity type semiconductor layer 3230, which is the first-first emission region of the first-first semiconductor light emitting device 310_1, can be designed such that a current density corresponding to the first color light having a preset first main wave is generated.

Accordingly, a semiconductor light emitting device located in the second region 1002 or the third region 1003 of the wafer 380, for example, the area of the first region 3230a of the first-second conductivity type semiconductor layer 3230 of each of the first-second semiconductor light emitting devices 310_2 (in FIG. 29) or first-third semiconductor light emitting devices 310_3 (in FIG. 30) can be designed to be larger or smaller based on the area of the first region 3230a of the first-second conductivity type semiconductor layer 3230 of the first-first semiconductor light emitting device 310_1.

FIG. 29 is a cross-sectional view illustrating a first-second semiconductor light emitting device according to a fourth embodiment.

Since the structure, shape, and/or function of the first-second semiconductor light emitting device 310_2 can be the same as that of the first-first semiconductor light emitting device 310_1 according to the embodiment, a detailed description of the structure will be omitted.

As shown in FIG. 29, the first-second semiconductor light emitting device 310_2 is a semiconductor light emitting device positioned in the second region 1002 of the wafer 380 and generates a first color light having a wave smaller than a preset first main wave.

Accordingly, in order to eliminate or minimize the wave deviation ΔWD of the first main wave, a first area 3230a of the first-second conductivity type semiconductor layer 3230 of the first-second semiconductor light emitting device 310_2 can be larger than the first area 3230a of the first-second conductivity type semiconductor layer 3230 of the first-first semiconductor light emitting device 310_1.

By the first area 3230a of the first-second conductivity type semiconductor layer 3230 of the first-second semiconductor light emitting device 310_2 is larger than the first area 3230a of the first-second conductivity type semiconductor layer 3230 of the first-first semiconductor light emitting device 310_1, as shown in FIG. 17, as the current density of the first area 3230a of the first-second conductivity type semiconductor layer 3230 of the first-second semiconductor light emitting device 310_2 decreases, as shown in FIG. 16, the first-second semiconductor light emitting device 310_2 shifted to increase toward a preset first main wave can be obtained.

Accordingly, the first main wave of the first color light compensated for in the first-second semiconductor light emitting device 310_2 can be the same as or close to the first main wave of the first color generated in the first-first semiconductor device.

FIG. 30 is a cross-sectional view illustrating a semiconductor light emitting device first-third according to a fourth embodiment.

Since the structure, shape, and/or function of the first-third semiconductor light emitting device 310_3 can be the same as that of the first-first semiconductor light emitting device 310_1 according to the embodiment, a detailed description of the structure will be omitted.

As shown in FIG. 30, The first-third semiconductor light emitting device 310_3 is a semiconductor light emitting device positioned in the third region 1003 of the wafer 380 and generates a first color light having a wave lager than a preset first main wave.

Accordingly, in order to eliminate or minimize the wave deviation ΔWD of the first main wave, a first area 3230a of the first-second conductivity type semiconductor layer 3230 of the first-third semiconductor light emitting device 310_3 can be smaller than the first area 3230a of the first-second conductivity type semiconductor layer 3230 of the first-first semiconductor light emitting device 310_1.

By the first area 3230a of the first-second conductivity type semiconductor layer 3230 of the first-third semiconductor light emitting device 310_3 is smaller than the first area 3230a of the first-second conductivity type semiconductor layer 3230 of the first-first semiconductor light emitting device 310_1, as shown in FIG. 17, as the current density of the first area 3230a of the first-second conductivity type semiconductor layer 3230 of the first-third semiconductor light emitting device 310_3 increases, as shown in FIG. 16, the first-third semiconductor light emitting device 310_3 shifted to decrease toward a preset first main wave can be obtained.

Accordingly, the first main wave of the first color light compensated by the first-third semiconductor light emitting device 310_3 can be the same as or close to the first main wave of the first color generated in the first-first semiconductor device.

From the above, by both the first-second semiconductor light emitting device 310_2 and the first-third semiconductor light emitting device 310_3 are compensated with the first main wave of the first color light generated by the first-first semiconductor light emitting device 310_1, the wave deviation ΔWD between the first-first semiconductor light emitting device 310_1, the first-second semiconductor light emitting device 310_2, and the first-third semiconductor light emitting device 310_3 can be removed or minimized.

Accordingly, when the display device 300 using the first-first semiconductor light emitting device 310_1, the first-second semiconductor light emitting device 310_2, and the first-third semiconductor light emitting device 310_3 is driven, the mura phenomenon due to the wave deviation ΔWD between the first-first semiconductor light emitting device 310_1, the first-second semiconductor light emitting device 310_2, and the first-third semiconductor light emitting device 310_3 may not occur.

The first semiconductor light emitting devices 310_1, 310_2, and 310_3 according to the above third and fourth embodiments can be vertical semiconductor light emitting devices in which two electrodes are disposed on opposite sides of each other.

On the other hand, as shown in FIGS. 31 and 32, it can be seen that the wave deviation of the semiconductor light emitting device for each position of the wafer in the embodiment can be significantly reduced compared to the conventional one.

FIG. 31 shows a wave deviation of a semiconductor light emitting device for each position of a wafer in the related art. And FIG. 32 illustrates a compensated wave deviation of a semiconductor light emitting device for each position of a wafer according to an embodiment.

As shown in FIG. 31, when there is no wave deviation compensation, the wave deviation is 4.7 nm. On the other hand, as shown in FIG. 32, when the wave deviation is compensated for according to the first to fourth embodiments, the wave deviation can be 2.3 nm or less.

The wave deviation of the first main wave between the plurality of first semiconductor light emitting devices 310_1, 310_2, 310_3 of the embodiment can be reduced by 48.94% compared to the conventional one, when the display device 300 is manufactured using these first semiconductor light emitting devices 310_1, 310_2, and 310_3 to display an image, the mura phenomenon may not occur.

Accordingly, in the embodiment, by adjusting the light emitting regions 341 and 342 of each of the plurality of first semiconductor light emitting devices 310_1, 310_2, 310_3 to remove or minimize the wave deviation between the plurality of first semiconductor light emitting devices 310_1, 310_2, 310_3, the mura phenomenon can be effectively removed.

In the embodiment, when the plurality of first semiconductor light emitting devices 310_1, 310_2, and 310_3 after compensating the wave deviation are mounted on the display substrate 301, deviation compensation does not need to be performed in hardware or software, so cost can be reduced and computational burden can be reduced.

Meanwhile, each of the second semiconductor light emitting device 320 and the third semiconductor light emitting device 330 can adopt the technical idea of minimizing the wave deviation by adjusting the light emitting regions 341 and 342 of the first semiconductor light emitting devices 310_1, 310_2 and 310_3 according to the first to fourth embodiments as it is.

Parts omitted from the following description can be easily understood from the above-described first to fourth embodiments.

<Second Semiconductor Light Emitting Device 320>

For example, each of the plurality of second semiconductor light emitting devices 320 (of FIG. 14) can have different light emitting regions 341 and 342 (of FIG. 18) in order to compensate for a wave deviation of the second main wave.

For example, the plurality of second semiconductor light emitting devices 320 can include a second-first semiconductor light emitting device, a second-second semiconductor light emitting device, and a second-third semiconductor light emitting device. Each of the second-first semiconductor light emitting device, the second-second semiconductor light emitting device, and the second-third semiconductor light emitting device can have the same structure as that of the first-first semiconductor light emitting device 310_1, the first-second semiconductor light emitting device 310_2, and the first-third semiconductor light emitting device 310_3 of the first semiconductor light emitting device.

For example, the second-first semiconductor light emitting device can have a second-first light emitting region that generates the second color light of the second main wave. For example, the second-second semiconductor light emitting device can have a second-second light emitting region having an area larger than that of the second-first light emitting region so that a wave smaller than the second main wave is compensated for as the second main wave. For example, the second-third semiconductor light emitting device can have the second-third light emitting region having an area smaller than the area of the second-first light emitting region so that a wave greater than the second main wave is compensated for by the second main wave.

For example, the second-second current density of the second-second light emitting region can be less than the second-first current density of the second-first light emitting region, the second-third current density of the second-third light emitting region can be greater than the second-first current density of the second-first light emitting region.

For example, the second semiconductor light emitting device 320 can include an active layer, and the second-first light emitting region, the second-second light emitting region, and the second-third light emitting region can be the active layer.

For example, the second semiconductor light emitting device 320 can include an active layer and a transparent conductive layer on one side of the active layer, the second-first light emitting area, the second-second light emitting area, and the second-third light emitting area can be the transparent conductive layer.

For example, the second semiconductor light emitting device 320 can include a second-first conductivity type semiconductor layer, an active layer disposed on the second-first conductivity type semiconductor layer, a second-second conductivity type semiconductor layer disposed on the active layer and a contact electrode on the second-second conductivity type semiconductor layer. For example, the second-first light emitting region, the second-second light emitting region, and the second-third light emitting region can be a contact area of a contact electrode in contact with the second-second conductivity type semiconductor layer.

For example, the second semiconductor light emitting device 320 can include a second-first conductivity type semiconductor layer, an active layer on the second-first conductivity type semiconductor layer, and a second-second conductivity type semiconductor layer having a first region and a second region surrounding the first region the active layer, and a current blocking layer on the second region of the second-second conductivity type semiconductor layer. The first-first emission region, the first-second emission region, and the first-third emission region can be the first region of the second-second conductivity type semiconductor layer.

For example, each of the second-first semiconductor light emitting device, the second-second semiconductor light emitting device, and the second-third semiconductor light emitting device can be disposed in a sub-pixel corresponding to a random position among the plurality of second sub-pixels.

Accordingly, as the embodiment adjusts the light emitting regions 341 and 342 of each of the plurality of second semiconductor light emitting devices 320 to eliminate or minimize the wave deviation between the plurality of second semiconductor light emitting devices 320, the mura phenomenon can be effectively removed.

In the embodiment, when a plurality of second semiconductor light emitting devices 320 without compensation for wave deviation are mounted on a display substrate 301 (in FIG. 14), since deviation compensation does not need to be performed in hardware or software, cost can be reduced and computational burden can be reduced.

<Third Semiconductor Light Emitting Device 330>

For example, each of the plurality of third semiconductor light emitting devices 330 can have different light emitting regions 341 and 342 (of FIG. 18) to compensate for a wave deviation of the third main wave.

For example, the plurality of third semiconductor light emitting devices 330 can include a third-first semiconductor light emitting device, a third-second semiconductor light emitting device, and a third-third semiconductor light emitting device. For example, the third-first semiconductor light emitting device can have a third-first light emitting region that generates the third color light of the third main wave.

For example, the third-second semiconductor light emitting device can have a third-second light emitting region having an area larger than that of the third-first light emitting region so that a wave smaller than the third main wave is compensated for as the third main wave. For example, the third-third semiconductor light emitting device can have the third-third light emitting region having an area smaller than the area of the third-first light emitting region so that a wave greater than the third main wave is compensated by the third main wave.

For example, the third-second current density of the third-second light emitting region can be smaller than the third-first current density of the third-first light emitting region, a third-third current density of the third-third light emitting area can be greater than a third-first current density of the third-first light emitting area.

For example, the area of each of the third-first light emitting region, the third-second light emitting area, and the third-third light emitting area can be 10% to 99% of the size of the third semiconductor light emitting device 330.

For example, the third semiconductor light emitting device 330 can include an active layer, and the third-first light emitting region, the third-second light emitting region, and the third-third light emitting region can be active layers.

For example, the third semiconductor light emitting device 330 can include an active layer and a transparent conductive layer on one side of the active layer. For example, the third-first light emitting region, the third-second light emitting region, and the third-third light emitting region can be a transparent conductive layer.

For example, the third semiconductor light emitting device 330 can include a third-first conductivity type semiconductor layer, an active layer on the third-first conductivity type semiconductor layer, a third-second conductivity type semiconductor layer on the active layer, and a contact electrode on the third-second conductivity type semiconductor layer. For example, the third-first light emitting region, the third-second light emitting region, and the third-third light emitting region can be contact areas of a contact electrode in contact with the third-second conductivity type semiconductor layer.

For example, the third semiconductor light emitting device 330 can include a third-first conductivity type semiconductor layer, an active layer on the third-first conductivity type semiconductor layer and a third-second conductivity type semiconductor layer having a first region and a second region surrounding the first region on the active layer, and a current blocking layer on the second region of the third-second conductivity type semiconductor layer. For example, the first-first emission region, the first-second emission region, and the first-third emission region can be the first region of the third-second conductivity type semiconductor layer.

For example, each of the third-first semiconductor light emitting device, the third-second semiconductor light emitting device, and the third-third semiconductor light emitting device can be disposed in a sub-pixel corresponding to a random position among the plurality of third sub-pixels.

Accordingly, as the embodiment adjusts the light emitting regions 341 and 342 of each of the plurality of third semiconductor light emitting devices 330 to remove or minimize the wave deviation between the plurality of third semiconductor light emitting devices 330, the mura phenomenon can be effectively removed.

In the embodiment, when a plurality of third semiconductor light emitting devices 330 without compensation for wave deviation are mounted on the display substrate 301, since deviation compensation does not need to be performed in hardware or software, cost and computational burden can be reduced.

Meanwhile, in the above embodiment, first semiconductor light emitting devices 310_1, 310_2, and 310_3 for generating first color light of a first main wave, the second semiconductor light emitting device 320 generating the second color light of the second main wave and a third semiconductor light emitting device 330 generating a third color light having a third main wave are disposed in each sub-pixel on the substrate 301 (in FIG. 14), the display device 300 for displaying an image has been described as above.

Alternatively, one semiconductor light emitting device among a plurality of first semiconductor light emitting devices 310_1, 310_2, and 310_3, a plurality of second semiconductor light emitting devices 320, and a plurality of third semiconductor light emitting devices 330 can be disposed on the substrate 301, an image can be displayed by providing a light source that generates a single color light of a specific main wave, and a color conversion layer on the light source that converts various color light.

For example, a plurality of third semiconductor light emitting devices 330 generating third color light having a third main wave, for example, blue light, can be used as the light source, but the present disclosure is not limited thereto. For example, the color conversion layer can include a red color conversion layer, a green color conversion layer, and a blue color conversion layer. In this case, the blue light generated by the plurality of third semiconductor light emitting device 330 of the light source passes through each of the red color conversion layer, the green color conversion layer, and the blue color conversion layer and is emitted as red light, green light, and blue light, so that an image can be displayed.

The above detailed description should not be construed as restrictive in all respects and should be considered as exemplary. The scope of the embodiments should be determined by a reasonable interpretation of the appended claims, and all modifications within the equivalent scope of the embodiments are included in the scope of the embodiments.

EXPLANATION OF REFERENCE LABELS IN THE DRAWINGS

300: display device
301: substrate
310: first semiconductor light emitting device
310_1: first-first semiconductor light emitting device
310_2: first-second semiconductor light emitting device
310_3: first-third semiconductor light emitting device
320: second semiconductor light emitting device
330: third semiconductor light emitting device
341, 342: light emitting area
380: wafer
3100, 3200: light emitting layer
3110, 3210: first conductivity type semiconductor layer
3120, 3220: active layer
3130, 3230: second conductivity type semiconductor layer
3140: transparent conductive layer
3150, 3250: insulating layer
3160: first electrode
3170: second electrode
3240: contact electrode
3260: current blocking layer
3230a: first area
3230b: second area
ΔWD: Wave deviation

What is claimed is:

1. A display device comprising:
a substrate including a plurality of first sub-pixels, a plurality of second sub-pixels, a plurality of third sub-pixels;
a plurality of first semiconductor light emitting devices disposed in the plurality of first sub-pixels, and configured to generate first color light of a first main wave;
a plurality of second semiconductor light emitting devices disposed in the plurality of second sub-pixels, and configured to generate second color light of a second main wave; and
a plurality of third semiconductor light emitting devices disposed in the plurality of third sub-pixels, and configured to generate third color light of a third main wave,
wherein at least some of the plurality of first semiconductor light emitting devices have different light emitting regions to compensate for a wave deviation of the first main wave, and
wherein each of the plurality of first semiconductor light emitting devices further comprises:
a first-first conductivity type semiconductor layer;
an active layer on the first-first conductivity type semiconductor layer;
a first-second conductivity type semiconductor layer disposed on the active layer and having a first region and a second region surrounding the first region; and
a current blocking layer on the second region of the first-second conductivity type semiconductor layer.

2. The display device according to claim 1, wherein the plurality of first semiconductor light emitting devices include a first-first type of semiconductor light emitting device, a first-second type of semiconductor light emitting device, and a first-third type of semiconductor light emitting device,
wherein the first-first type of semiconductor light emitting device has a first-first light emitting region configured to generate the first color light of the first main wave,
wherein the first-second type of semiconductor light emitting device has a first-second light emitting region having an area larger than an area of the first-first light emitting region and is configured to output the first color light with a smaller wave than the first main wave, and
wherein the first-third type of semiconductor light emitting device has a first-third light emitting region having a smaller area than the first-first light emitting region and is configured to output the first color light with a larger wave than the first main wave.

3. The display device according to claim 2, wherein a first-second current density of the first-second emitting region is less than a first-first current density of the first-first light emitting region, and
wherein a first-third current density of the first-third emitting region is greater than the first-first current density of the first-first emission region.

4. The display device according to claim 2, wherein each area of each of the first-first light emitting region, the first-second light emitting region, and the first-third light emitting region is 10% to 99% of a size of the first semiconductor light emitting device, and
wherein the wave deviation refers to a position where warping occurred between the plurality of first semiconductor light emitting devices.

5. The display device according to claim 2,
wherein each of the first-first light emitting region, the first-second light emitting region, and the first-third light emitting region is an active layer of a corresponding first semiconductor light emitting device among of the plurality of first semiconductor light emitting devices.

6. The display device according to claim 1, wherein each of the plurality of first semiconductor light emitting devices further comprises:
a transparent conductivity type layer on one side of the active layer, and
wherein each of the first-first light emitting region, the first-second light emitting region, and the first-third light emitting region is the transparent conductivity type layer of a corresponding first semiconductor light emitting device among of the plurality of first semiconductor light emitting devices.

7. The display device according to claim 1, wherein each of the plurality of first semiconductor light emitting devices further comprises:

a contact electrode on the first-second conductivity type semiconductor layer, and
wherein each of the first-first light emitting region, the first-second light emitting region, and the first-third light emitting region is a contact area of the contact electrode of a corresponding first semiconductor light emitting device among of the plurality of first semiconductor light emitting devices, the contact area being in contact with a corresponding first-second conductivity type semiconductor layer.

8. The display device according to claim 1,
wherein each of the first-first light emitting region, the first-second light emitting region, and the first-third light emitting region is the first region of the first-second conductivity type semiconductor layer of a corresponding first semiconductor light emitting device among of the plurality of first semiconductor light emitting devices.

9. The display device according to claim 2, wherein each of the first-first semiconductor light emitting device, the first-second semiconductor light emitting device, and the first-third semiconductor light emitting device is disposed in a sub-pixel corresponding to a position among the plurality of first sub-pixels.

10. The display device according to claim 1, wherein at least some of the plurality of second semiconductor light emitting devices have different light emitting regions to compensate for a wave deviation of the second main wave.

11. The display device according to claim 1, wherein the plurality of second semiconductor light emitting devices include a second-first type of semiconductor light emitting device, a second-second type of semiconductor light emitting device, and a second-third type of semiconductor light emitting device,
wherein the second-first type of semiconductor light emitting device has a second-first light emitting region configured to generate the second color light of the second main wave,
wherein the second-second semiconductor type of light emitting device has a second-second light emitting region having an area larger than an area of the second-first light emitting region and is configured to output the second color light with a smaller wave than the second main wave, and
wherein the second-third type of semiconductor light emitting device has a second-third light emitting region having a smaller area than the second-first light emitting region and is configured to output the second color light with a larger wave than the second main wave.

12. The display device according to claim 11, wherein a second-second current density of the second-second light emitting region is less than a second-first current density of the second-first light emitting region, and
wherein a second-third current density of the second-third light emitting region is greater than the second-first current density of the second-first light emitting region.

13. The display device according to claim 11, wherein each area of the second-first light emitting region, the second-second light emitting region, and the second-third light emitting region is 10% to 99% of a size of a corresponding second semiconductor light emitting device among of the plurality of second semiconductor light emitting devices.

14. The display device according to claim 11, wherein each of the second-first light emitting region, the second-second light emitting region, and the second-third light emitting region is an active layer of a corresponding second semiconductor light emitting device among of the plurality of second semiconductor light emitting devices.

15. The display device according to claim 11, wherein each of the plurality of second semiconductor light emitting devices further comprises:
a transparent conductive layer on one side of the active layer, and
wherein each of the second-first light emitting region, the second-second light emitting region, and the second-third light emitting region is the transparent conductive layer of a corresponding second semiconductor light emitting device among the plurality of second semiconductor light emitting devices.

16. The display device according to claim 11, wherein each of the plurality of second semiconductor light emitting devices further comprises:
a contact electrode on the second-second conductivity type semiconductor layer, and
wherein each of the second-first light emitting region, the second-second light emitting region, and the second-third light emitting region is a contact area of the contact electrode of a corresponding second semiconductor light emitting device among the plurality of second semiconductor light emitting devices, the contact area being in contact with a corresponding second-second conductivity type semiconductor layer.

17. The display device according to claim 11, wherein each of the second-first semiconductor light emitting device, the second-second semiconductor light emitting device, and the second-third semiconductor light emitting device is disposed in a sub-pixel corresponding to a position among the plurality of second sub-pixels.

18. The display device according to claim 1, wherein at least some of the plurality of third semiconductor light emitting devices have a different light emitting regions to compensate for a wave deviation of the third main wave.

19. The display device according to claim 18, wherein the plurality of third semiconductor light emitting devices include a third-first type of semiconductor light emitting device, a third-second type of semiconductor light emitting device, and a third-third type of semiconductor light emitting device,
wherein the third-first type of semiconductor light emitting device has a third-first light emitting region configured to generate the third color light of the third main wave,
wherein the third-second type of semiconductor light emitting device has a third-second light emitting region having an area larger than an area of the third-first light emitting region and is configured to output the third color light with a smaller wave than the third main wave, and
wherein the third-third type of semiconductor light emitting device has a third-third light emitting region having a smaller area than the third-first light emitting region and is configured to output the third color light with a larger wave than the third main wave.

20. A display device comprising:
a substrate including a plurality of first sub-pixels, a plurality of second sub-pixels a plurality of third sub-pixels;
a plurality of first semiconductor light emitting devices disposed in the plurality of first sub-pixels, and configured to generate first color light of a first main wave;

a plurality of second semiconductor light emitting devices disposed in the plurality of second sub-pixels, and configured to generate second color light of a second main wave; and a plurality of third semiconductor light emitting devices disposed in the plurality of third sub-pixels, and configured to generate third color light of a third main wave, wherein at least some of the plurality of first semiconductor light emitting devices have different light emitting regions to compensate for a wave deviation of the first main wave, wherein each of the plurality of second semiconductor light emitting devices comprises:
- a second-first conductive type semiconductor layer; an active layer on the second-first conductive type semiconductor layer;
- a second-second conductivity type semiconductor layer disposed on one side of the active layer and having a first region and a second region surrounding the first region; and
- a current blocking layer on the second region of the second-second conductivity type semiconductor layer.

* * * * *